(12) United States Patent
Oda

(10) Patent No.: US 6,905,972 B2
(45) Date of Patent: Jun. 14, 2005

(54) SEMICONDUCTOR DEVICE AND METHOD FOR MANUFACTURING THE SAME

(75) Inventor: Katsuya Oda, Hachioji (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/150,943

(22) Filed: May 21, 2002

(65) Prior Publication Data

US 2003/0045063 A1 Mar. 6, 2003

(30) Foreign Application Priority Data

Sep. 3, 2001 (JP) ........................................ 2001-265362

(51) Int. Cl.[7] ............................................. H01L 21/302
(52) U.S. Cl. ....................... 438/716; 438/464; 438/618
(58) Field of Search ................................. 438/464, 716, 438/618; 118/64, 666, 667, 500

(56) References Cited

U.S. PATENT DOCUMENTS

| 5,321,301 A | | 6/1994 | Sato et al. | |
|---|---|---|---|---|
| 5,766,360 A | * | 6/1998 | Sato et al. | 118/666 |
| 5,962,880 A | | 10/1999 | Oda et al. | |
| 6,488,778 B1 | * | 12/2002 | Ballantine et al. | 118/719 |

FOREIGN PATENT DOCUMENTS

JP          10-041321          7/1996

* cited by examiner

Primary Examiner—Long Pham
Assistant Examiner—Wai-Sing Louie
(74) Attorney, Agent, or Firm—Reed Smith LLP; Stanley P. Fisher, Esq.; Juan Carlos A. Marquez, Esq.

(57) ABSTRACT

A method of manufacturing a semiconductor device comprising a plurality of single-crystal semiconductor layers formed, for example, in an opening of an insulating film, said semiconductor layers having no or very few crystal defects. The method comprises forming in a first growth chamber a first semiconductor layer of a first conductivity type in an opening of an insulating film and subsequently forming in a second growth chamber a second semiconductor layer of a second conductivity type in an opening of an insulating film, while supplying hydrogen to the surface of the substrate when the substrate is transferred from said first growth chamber to said second growth chamber.

5 Claims, 26 Drawing Sheets

SEMICONDUCTOR DEVICE AND METHOD FOR MANUFACTURING THE SAME

CLAIM OF PRIORITY

This application claims priority to Japanese Patent Application No. 2001-265362 filed on Sep. 3, 2001.

BACKGROUND OF THE INVENTION

1. Field of the Invention

The present invention relates to a semiconductor device, a method for manufacturing the same, and semiconductor production equipment suitable for such manufacturing, and more particularly, the present invention relates to a semiconductor device having a multilayered semiconductor film comprised of a plurality of single-crystal layers differing in conductivity type.

2. Description of the Background

A conventional semiconductor device includes a multilayered semiconductor film composed of single-crystal silicon layers or single-crystal silicon-germanium layers. An exemplary device, known as a bipolar transistor, is disclosed in Japanese Patent Laid-open No. 41321/1998 example. The disclosed method consists of continuously forming a p-type silicon-germanium layer (the base layer) and an n-type silicon layer (the emitter layer) by epitaxial growth in the same growth chamber. This continuous growth method necessitates the switching of doping gases because the base layer and the emitter layer differ in conductivity type. This switching process is accomplished by replacing diborane (containing a p-type impurity), with phosphine (containing an n-type impurity) which are supplied with hydrogen as a carrier gas.

Likewise, a semiconductor device including a multilayered semiconductor film is disclosed in Japanese Patent Laid-open No. 299429/1993. The device includes a base layer and an emitter layer formed by epitaxial growth. The disclosed method is characterized in that after the base layer has been formed by epitaxial growth, the wafer is removed from the growth chamber and undergoes deposition of an insulating film and etching to open the emitter region. Thereafter, the wafer is again placed in the growth chamber for the growth of the emitter layer.

Another example of a semiconductor device including a multilayered semiconductor layer is disclosed in Japanese Patent Laid-open No. 79394/1998. This device is a bipolar transistor in which the emitter layer is formed by diffusion of an n-type impurity. A cross-section of this bipolar transistor is shown in FIG. 29.

In FIG. 29, there is shown a p-type silicon substrate 101 having a heavily doped n-type buried layer 125 formed in the emitter and collector regions. On the entire surface of the substrate 101, a lightly doped n-type collector layer 103 is formed by epitaxial growth. The device isolation layer 104 is formed on the surface excluding the emitter region. Other structures formed include a collector-base isolating insulation films 107 and 108, a base lead electrode 109 of p-type polycrystalline silicon, an opening in the emitter-base isolating insulation film 110, and an emitter-base isolating insulation film 111 on the side wall of the base lead electrode 109. In the opening, a lightly doped n-type collector 112 of single-crystal silicon-germanium, a p-type intrinsic base layer 113 of single-crystal silicon-germanium, and a p-type extrinsic base layer 114 of polycrystalline silicon-germanium are formed.

The extrinsic base layer is covered with the emitter-base isolating insulation films 115 and 116. Subsequently, an emitter electrode 118 of heavily doped n-type polycrystalline silicon is deposited. This step is followed by annealing to form the emitter region 119. The insulation film 120 is deposited, and openings are then made for the emitter, base, and collector. A heavily doped n-type collector lead-out layer 121 is formed, and electrodes 122, 123, and 124 are formed in the openings for the emitter, base, and collector. The collector region 102 and the device isolation layers 105 and 106 are also shown. The growth sequence for this semiconductor device is shown in FIG. 28.

According to the above-mentioned conventional technology, layers differing in conductivity type are continuously formed by epitaxial growth. A disadvantage of the conventional technology is that an impurity not intended to be doped is incorporated into the epitaxially growing layer because of the memory effect. This prevents accurate impurity control because the original dopant concentration is cancelled by the incorporated impurity. Another disadvantage is the possibility of the growing surface adsorbing unintended impurities because of the memory effect. Such impurities reduce the growth rate and deteriorate the crystal properties.

Moreover, the above-mentioned conventional multilayered semiconductor film composed of layers of single-crystal silicon or single-crystal silicon-germanium tends to capture contaminants (such as oxygen and carbon) at the interface between the single-crystal layer of a first conductivity type and the single-crystal layer of a second conductivity type. Such contaminants cause leakage current in a bipolar transistor including an emitter-base junction.

To illustrate the conventional technology for a multilayered film comprised of layers differing in conductivity type, there is shown in FIGS. 30 and 31 the germanium content and the depthwise profile of dopant concentration in the intrinsic part of a bipolar transistor. The profile shown in FIG. 30 is one which is observed when a base layer of p-type single-crystal silicon-germanium is formed, and a heavily doped n-type polycrystalline silicon is then deposited thereon. Contaminants due to growth interruption are present in the interface at a depth of D1 from the surface. In order to form the emitter layer in the single-crystal layer, it is necessary to form the pn junction at a position deeper than D1 by annealing, which causes the n-type dopant to diffuse from the heavily doped n-type polycrystalline silicon layer. This annealing may be accomplished at 900° C. for 30 seconds, for example.

As a result of annealing, the dopant profile changes from the one shown in FIG. 30 to the one shown in FIG. 31. Annealing not only causes the n-type impurity to diffuse but also causes the p-type impurity in the base layer to diffuse into the substrate. Therefore, the base width after annealing becomes D2'–D1' in FIG. 31. This value is larger than the thickness (D2–D1) of the p-type layer measured immediately after the p-type single-crystal silicon-germanium layer has been formed. Thus, the resulting bipolar transistor has a decreased cutoff frequency. In addition, any attempt to increase the p-type dopant concentration in the base layer in order to reduce the base resistance results in a high amount of impurity diffusion due to annealing, which in turn leads to an increased base width.

SUMMARY OF THE INVENTION

The present invention preferably provides a semiconductor device having a semiconductor multilayered film comprised of a plurality of single-crystal layers differing in conductivity type or a semiconductor multilayered film comprised of a plurality of single-crystal layers differing in dopant concentration, with the multilayered film having no or very few crystal defects. The present invention also preferably provides a method for manufacturing said semiconductor device as well as semiconductor production equipment suitable for the manufacture of said semiconductor device.

A semiconductor device according to the present invention comprises: an insulating film with an opening made therein which formed on a single-crystal substrate; a first semiconductor layer formed in said opening in said insulating film and with a dopant concentration for a first conductivity type that is no lower than $1 \times 10^{19}$ cm$^{-3}$; and a second semiconductor layer formed on said first semiconductor layer and with a dopant concentration for a second conductivity type (which is opposite to a first conductivity type) that is no lower than $1 \times 10^{19}$ cm$^{-3}$. The oxygen concentration is preferably no higher than $5 \times 10^{18}$ cm$^{-3}$ and the carbon concentration no higher than $5 \times 10^{17}$ cm$^{-3}$ in the first semiconductor layer, the second semiconductor layer, and the interface between the first semiconductor layer and the second semiconductor layer.

The first semiconductor layer preferably has a dopant concentration no higher than $1 \times 10^{21}$ cm$^{-3}$ such that it maintains desirable good crystalline characteristics. The second semiconductor layer should also have a dopant concentration no higher than $1 \times 10^{21}$ cm$^{-3}$ for similar reasons.

The present invention may also be directed to a semiconductor device which comprises: an insulating film with an opening made therein which is formed on a single-crystal substrate; a first semiconductor layer formed in said opening in said insulating film and with a dopant concentration for a first conductivity type that is no lower than $1 \times 10^{19}$ cm$^{-3}$; and a second semiconductor layer formed on said first semiconductor layer and with a dopant concentration for a second conductivity type (which is opposite to a first conductivity-type) that is no lower than $1 \times 10^{19}$ cm$^{-3}$. An oxygen concentration no higher than $5 \times 10^{18}$ cm$^{-3}$ and a carbon concentration no higher than $5 \times 10^{17}$ cm$^{-3}$ are found in the first semiconductor layer, the second semiconductor layer, and the interface between the first semiconductor layer and the second semiconductor layer.

In this embodiment, the first semiconductor layer preferably has a dopant concentration no higher than $1 \times 10^{21}$ cm$^{-3}$ for the same reasons as mentioned above. The second semiconductor layer preferably has a dopant concentration no lower than $1 \times 10^{18}$ cm$^{-3}$ so that it will not have an excessively high resistance.

In the semiconductor device according to the present invention, the first semiconductor layer should have a thickness of no larger than 20 nm and preferably no larger than 5 nm for adequate thickness control. In the case where the semiconductor device has a bipolar transistor, it is desirable that the first semiconductor layer function as the base of the bipolar transistor and the second semiconductor layer function as the emitter of the bipolar transistor.

The present invention is also directed to a semiconductor device which comprises: an insulating film with an opening made therein which is formed on a single-crystal substrate; a first semiconductor layer with a dopant concentration that is no lower than $5 \times 10^{18}$ cm$^{-3}$; and a second semiconductor with a dopant concentration that is no higher than $5 \times 10^{16}$ cm$^{-3}$. Said first and second semiconductor layers are arranged in said opening in said insulating film in the order mentioned or in the reverse order, and an oxygen concentration no higher than $5 \times 10^{18}$ cm$^{-3}$ and a carbon concentration no higher than $5 \times 10^{17}$ cm$^{-3}$ exists in the first semiconductor layer, the second semiconductor layer, and the interface between either the first and second semiconductor layers (whichever is closer to the substrate) and a third semiconductor layer arranged thereon or between either of the first and second semiconductor layers (whichever is further from the substrate) and a third semiconductor layer arranged thereunder.

In the semiconductor device according to the present invention, the first and second semiconductor layers may be in direct contact with each other or may be separated by a third semiconductor layer. Consequently, in the case where the two semiconductor layers are in direct contact with each other, the interface between them is identical with that between either of the first and second semiconductor layers (whichever is closer to the substrate) and a third semiconductor layer arranged thereon. The dopant concentration of the first semiconductor layer should preferably be no higher than $1 \times 10^{21}$ cm$^{-3}$, and the dopant concentration of the second semiconductor layer should preferably be no lower than $1.45 \times 10^{10}$ cm$^{-3}$.

In at least one exemplary embodiment, the present invention is directed to a semiconductor device which comprises: an insulating film with an opening made therein which is formed on a single-crystal substrate; a first semiconductor layer containing a dopant formed in said opening in said insulating film; and a second semiconductor layer containing a dopant formed on said first semiconductor layer and whose dopant concentration differs from that of the first semiconductor layer. The dopant concentration preferably changes from $1 \times 10^{18}$ cm$^{-3}$ to $1 \times 10^{17}$ cm$^{-3}$ in the part of the layer which is not thicker than 5 nm.

The thickness within which the dopant concentration changes as mentioned above should preferably be near zero; however, the thickness may exceed 1 nm The part in which the dopant concentration changes may be present in the first semiconductor layer or another semiconductor layer adjacent thereto. This will be explained below with reference to an example. In conventional semiconductor devices, the dopant concentration gradually changes in the vicinity of the interface due to heat treatment as shown in FIG. 31. By contrast, in the semiconductor device according to the present invention, the dopant concentration abruptly changes as shown in FIG. 30. However, FIG. 30 shows the state observed immediately after fabrication, and the change in dopant concentration slightly increases because a very small amount of dopant diffuses to the adjacent semiconductor layer a long time after fabrication or if the temperature for fabrication is high. The above-mentioned change in dopant concentration may take place in the first semiconductor layer or in another semiconductor layer to which a dopant has diffused.

The first semiconductor layer in this semiconductor device should preferably have a thickness no larger than 20 nm and no smaller than 5 nm. In addition, the first semiconductor layer should preferably have a dopant concentration of at least $1 \times 10^{19}$ cm$^{-3}$ but no more than $1 \times 10^{21}$ cm$^{-3}$. The reason for this limitation is the same as that mentioned above.

The present invention is also directed to a method for manufacturing a semiconductor device including a plurality of semiconductor layers differing in conductivity type in an opening made in an insulating film formed on a substrate.

The method comprises the steps of forming in a first growth chamber a first semiconductor layer of a first conductivity type in said opening and subsequently forming in a second growth chamber a second semiconductor layer of a second conductivity type, which is opposite to said first conductivity type, on said first semiconductor layer. Hydrogen if supplied to the surface of the substrate when the substrate is transferred from said first growth chamber to said second growth chamber.

The present invention is also directed to a method for manufacturing a semiconductor device having a plurality of semiconductor layers in an opening made in an insulating film formed on a substrate. The method comprises the steps of forming in a first growth chamber a first semiconductor layer containing an impurity in said opening and subsequently forming in a second growth chamber a second semiconductor layer containing an impurity on said first semiconductor layer. Hydrogen if supplied to the surface of the substrate such that said second semiconductor layer contains less impurity than said first semiconductor layer when the substrate is transferred from said first growth chamber to said second growth chamber.

According to the method of the present invention, the substrate transfer should be carried out in an atmosphere with a hydrogen partial pressure of at least 10 Pa (but lower than atmospheric pressure for equipment safety). The hydrogen supply should be carried out at a flow rate of more than 10 mL/min for good control but lower than 100 L/min for safe exhaust disposal. During transfer, the substrate temperature should preferably be kept above 100° C. The first and second semiconductor layers are preferably formed by epitaxial growth.

The present invention may also be directed to a method for manufacturing a semiconductor device including a plurality of semiconductor layers differing in conductivity type in an opening made in an insulating film formed on a substrate. The method comprising a first step of forming in a growth chamber a first semiconductor layer of a first conductivity type in said opening and a second step of forming in the same growth chamber a second semiconductor layer of a second conductivity type, which is opposite to said first conductivity type, on said first semiconductor layer. The substrate is temporarily placed in a hydrogen atmosphere for removal of deposits from the growth chamber at the time of shifting from the first step to the seconds step. The first and second semiconductor layers are preferably formed by epitaxial growth.

In at least one embodiment the present invention is directed to semiconductor production equipment comprising a plurality of growth chambers for layer growing and a plurality of transfer chambers for transferring substrates from one growth chamber to another. The growth chambers and transfer chambers are preferably equipped with a means to supply hydrogen gas thereinto.

The semiconductor production equipment is preferably operated in such a way that the growth chambers and transfer chambers have a degree of vacuum of no higher than $1 \times 10^{-5}$ Pa. During transfer of the substrate, the growth chambers and transfer chambers may be supplied with hydrogen gas containing atomic hydrogen which has been generated at any place other than the substrate surface. In addition, during transfer of the substrate, the substrate temperature should preferably be kept above 100° C. The semiconductor production equipment may additionally have a cleaning chamber in which the substrate surface is cleaned. This cleaning chamber should preferably be kept at a degree of vacuum no higher than $1 \times 10^{-5}$ Pa.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

Figure 1:
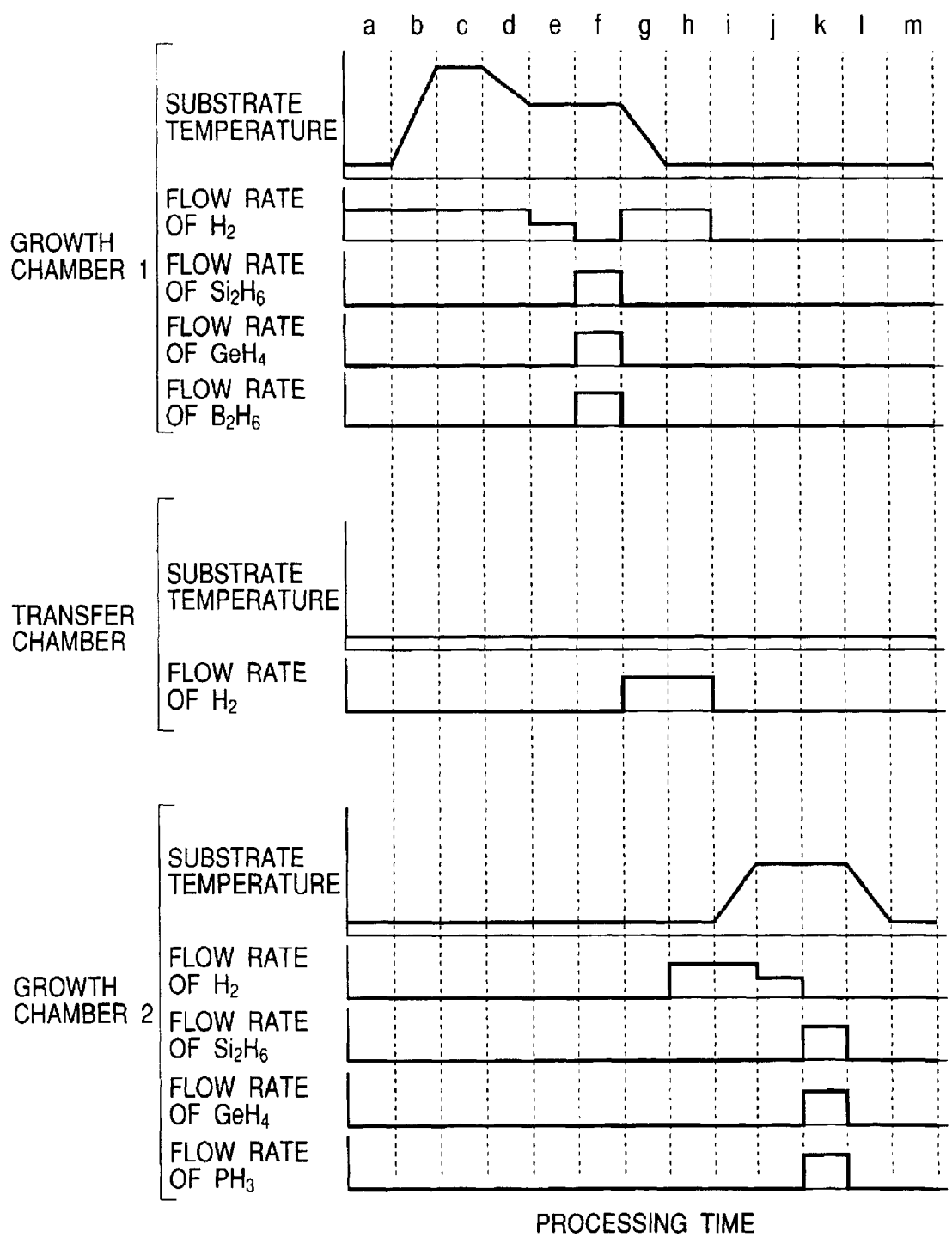
FIG. 1 is a diagram showing the growth sequence in the first example for fabrication of a semiconductor device according to the present invention.

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

The present invention is embodied in a method for manufacturing a semiconductor device. This method comprises the steps of: cleaning a silicon substrate; cooling the substrate in a hydrogen atmosphere to a temperature suitable for epitaxial growth; forming on the substrate surface a p-type single-crystal silicon-germanium layer; cooling the substrate again in a hydrogen atmosphere; transferring the substrate to another growth chamber for n-type doping (while supplying hydrogen continuously during this transfer); placing the substrate in another growth chamber; heating the substrate while supplying hydrogen gas until a prescribed temperature is reached; and supplying a reactant gas together with a dopant gas for epitaxial growth, thereby forming an n-type single-crystal silicon layer. The foregoing process permits the production of a semiconductor single-crystal multilayered film free of contaminants (such as oxygen, carbon, nitrogen, and fluorine) in the interface between the substrate and the single-crystal layer or the interface between one single-crystal layer and the other. In addition, cleaning the substrate surface only once before epitaxial growth makes it possible to form a heavily doped, but comparatively thin semiconductor layer.

The foregoing process yields a bipolar transistor in which the intrinsic base is a p-type single-crystal silicon-germanium layer thinner than 20 nm. The result is an improvement in the cutoff frequency and a decrease in the leakage current across the emitter-base junction compared to conventional devices. This contributes to a high-speed, high-performance semiconductor integrated circuit.

The following examples of the invention are described in more detail with reference to the accompanying drawings.

EXAMPLE 1

This example demonstrates a first process for fabricating a semiconductor device according to the present invention. The process follows the growth sequence shown in FIG. 1. The growth sequence is a graphical representation of the substrate temperature and gas flow rate as the values change with time (in consecutive steps) when a multilayered film comprising a single-crystal silicon-germanium layer doped in p-type and a single-crystal silicon-germanium layer doped in n-type is selectively formed in an opening of an insulating film.

The substrate temperature is the temperature of the station in which the substrate is placed. Any temperature given for a vacant station indicates that the station is heated so that the substrate would have the temperature if it was present there. The vertical axis represents the substrate temperature and gas flow rate, which are plotted on an arbitrary scale. The plots denote the relative increase or decrease of the temperature and gas flow rate, but their actual adjustment should be made according to the growth temperature, the compositional ratio of germanium, and the doping concentration. This note applies to other examples that follow.

Figure 2:
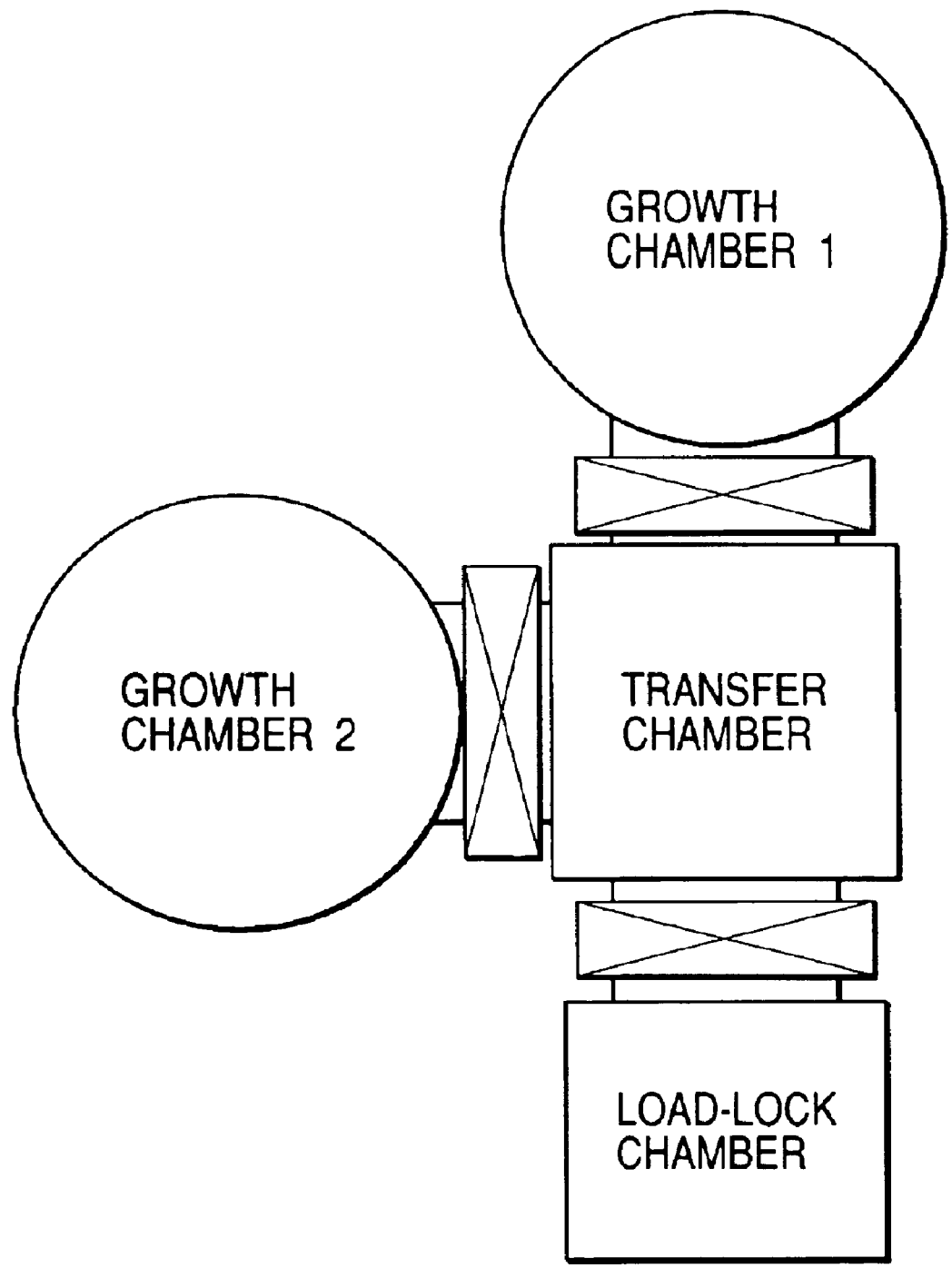
FIG. 2 is a schematic diagram showing semiconductor production equipment used in one example of the present invention.

The process in this example employs a semiconductor production equipment constructed as shown in FIG. 2. The equipment has two growth chambers for the following reasons. To form a multilayered film, it is necessary to repeat the doping process for different conductivity types. If doping for one conductivity type and subsequent doping for another conductivity type are carried out sequentially in the same growth chamber, it is difficult to control the doping concentration because the growth chamber contains the residual dopant molecules which are captured by the substrate or which prevent the gas from being adsorbed by the crystal growing surface. The result is an uneven crystal growth and an epitaxial layer with poor crystallinity. Therefore, in order to form a semiconductor multilayered film comprising layers differing in conductivity type, it is preferable to use more than one growth chamber for the respective conductivity types. Thus, the process in this example employs two growth chambers which are separated from each other. Growth chamber 1 is for a semiconductor layer doped in p-type and growth chamber 2 is for a semiconductor layer doped in n-type.

The process in this example will be explained below with reference to FIGS. 1 and 2. The process begins with cleaning the substrate to make its surface free of contaminants and native oxide film. This cleaning employs a hot aqueous solution of ammonia and hydrogen peroxide, which effectively removes heavy metals, organic matters, and particles from the substrate surface. Then, the substrate is cleaned with diluted hydrofluoric acid to remove the oxide film formed by the preceding cleaning step. Finally, the substrate is rinsed with pure water. The cleaned surface is in a state of terminating with hydrogen atoms. This state, in which silicon atoms present at the outermost surface of the substrate are combined with hydrogen atoms, protects the substrate surface from natural oxidation before the growing step starts. For the cleaning procedure to produce the effect of hydrogen termination to avoid natural oxidation, it is desirable to transfer substrates in a clean nitrogen atmosphere so as to protect them from oxidation and contamination after cleaning. Transfer in this manner is also applied to the substrates which are cleaned before epitaxial growth described below.

Subsequently, the cleaned substrate is placed in the load-lock chamber shown in FIG. 2. After the load-lock chamber has been evacuated, the substrate is transferred to the growth chamber 1 through the transfer chamber. For the prevention of contamination, it is desirable to keep the transfer chamber and the growth chamber 1 in a high vacuum state, e.g., lower than $1\times10^{-5}$ Pa. This applies also to the growth chamber 2 mentioned below. In addition, it is necessary to prevent any gas containing oxygen, moisture, and organic contaminants from entering the transfer chamber and growth chambers 1 and 2, so as to protect the single-crystal layers grown in the chambers from crystal defects resulting from captured oxygen and carbon. The transfer of substrates should be commenced after the pressure in the load-lock chamber has dropped below $1\times10^{-5}$ Pa.

The substrate is cleaned again before epitaxial growth because the substrate surface is subject to inevitable oxidation and contamination during transfer despite hydrogen termination. This cleaning process is accomplished by heating in a vacuum, so that the substrate surface is cleaned of native oxide film by the following reaction.

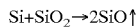

$$Si+SiO_2 \rightarrow 2SiO\uparrow$$

An alternative way of cleaning is by heating the substrate in the growth chamber 1 which is being supplied with pure hydrogen. Heating in hydrogen has an advantage over heating in a vacuum because the latter releases terminating hydrogen atoms from the substrate surface when the substrate temperature exceeds 500° C. Bare silicon atoms on the substrate surface react with moisture and oxygen contained in the atmosphere of the growth chamber, resulting in the substrate surface becoming oxidized. As this oxide film is reduced in subsequent steps, the substrate surface becomes more irregular, producing an adverse effect on uniform epitaxial growth and crystallinity.

Moreover, the substrate surface is subject to contamination with carbon dioxide and organic gases contained in the atmosphere of the growth chamber. Carbon contamination deteriorates the crystallinity of the epitaxially grown layer. By contrast, heating in hydrogen above 500° C. permits silicon atoms on the substrate surface to absorb and desorb hydrogen atoms repeatedly because the substrate surface is exposed to pure hydrogen continuously. As a result, the substrate surface remains clean without being reoxidized and becoming rough during cleaning.

For cleaning in the hydrogen atmosphere, the growth chamber 1 is supplied with hydrogen gas (as indicated by "step a" in FIG. 1). Before hydrogen supply, the substrate temperature should preferably be kept below 500° C. so as to prevent hydrogen from releasing itself from the substrate surface. The flow rate of hydrogen should preferably be at least 10 mL/min for adequate supply control and no more than 100 L/min for safe exhaust disposal. The partial pressure of hydrogen in the growth chamber 1 may range from a lower limit of 10 Pa (for uniform hydrogen supply to the substrate surface) to the upper limit of atmospheric pressure (for equipment safety).

While the growth chamber 1 is being supplied with hydrogen gas, the substrate is heated to the cleaning-temperature (as indicated by "step b"). This heating may be accomplished in any way so long as there is no possibility of substrate contamination or extreme temperature variations in the substrate. Typical heating methods include induction heating, resistance heating, and radiation heating by a lamp (the latter one being capable of controlling the temperature within a short time period). These heating methods are also applied to the single-crystal growth mentioned below.

The above-mentioned cleaning temperature is maintained for a prescribed period of time so that the substrate surface is cleaned of contaminants and naturally formed oxide film (as indicated by "step c"). The cleaning temperature may range from 600° C. (for cleaning effect) to 1000° C. (for significant dopant diffusion into the substrate). In addition, the cleaning temperature should preferably be as low as possible so that heating affects on the structure which has been formed before epitaxial growth are limited. The effect of cleaning the substrate surface of contaminants and native oxide film varies depending on the cleaning temperature. It manifests itself in a shorter time as the temperature increases. Therefore, prolonged heating should be avoided.

Figure 3:
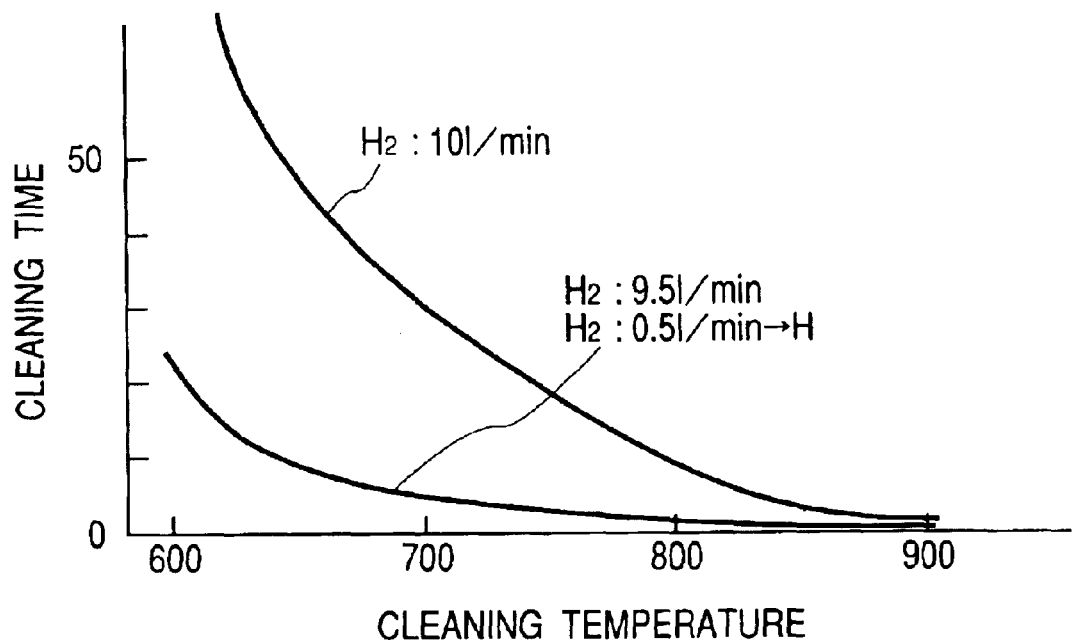
FIG. 3 is a graph showing the relationship between the cleaning temperature and the cleaning time in a cleaning process with hydrogen.

In FIG. 3, the cleaning temperature is plotted against the minimum time for cleaning effect. It is noted from this figure that a cleaning time of 30 minutes is necessary for the cleaning temperature of 700° C. (at which the cleaning effect is weak), whereas a cleaning time of 2 minutes is sufficient for the cleaning temperature of 900° C. One effect on the existing structure is the diffusion of dopant into the substrate which alters the characteristic properties. For the prevention of dopant diffusion, the cleaning temperature should preferably be below 800° C. and the cleaning time should preferably be about 10 minutes.

One way to lower the cleaning temperature is to use atomic hydrogen for cleaning. Active atomic hydrogen reduces oxygen on the substrate surface even at room temperature. Hydrogen gas may be converted into atomic hydrogen by heating on a tungsten filament (for thermal dissociation), by plasma generation (for electrical dissociation), or by irradiation with ultraviolet light. In any of these processes, great care should be exercised about contamination with metal originating from the filaments and electrodes for heating and plasma generation or with substances produced from quartz parts by plasma. None of these processes give rise to a large amount of atomic hydrogen; only a small portion of hydrogen molecules is dissociated into atomic hydrogen. If it is assumed that 5% of hydrogen molecules supplied are converted into atomic hydrogen, the reduced substrate temperature is related with the cleaning time as shown in FIG. 3. It is noted that a substrate temperature of 650° C. is adequate for a cleaning time of about 10 minutes. This method for cleaning with hydrogen is applicable to other examples mentioned later.

After cleaning is complete, the substrate temperature is lowered for epitaxial growth (as indicated by "step d"). The substrate is allowed to stand for a while until a stable substrate temperature for epitaxial growth is reached (as indicated by "step e"). In "step e" for temperature stabilization, it is desirable to continue supplying hydrogen gas to keep the substrate surface clean. However, hydrogen gas cools the substrate surface and, hence, changes the substrate temperature in proportion to its flow rate so long as the heating conditions remain unchanged. It follows therefore that a substrate temperature which remains stable under the condition that the flow rate of hydrogen gas largely differs from that of gas for epitaxial growth will greatly change when the flow rate of gas changes after the start of epitaxial growth. A desirable practice in "step e" to avoid this trouble is to supply hydrogen gas at a flow rate approximately equal to that of all gases for epitaxial growth.

"Step e" for temperature stabilizing is not always necessary. An alternative way is to lower the substrate temperature while controlling the flow rate of hydrogen, gas such that the flow rate of hydrogen gas becomes equal to that of the gas for epitaxial growth when the substrate temperature reaches the epitaxial growth temperature. In this way, it is possible to begin epitaxial growth as soon as the substrate temperature is lowered. This greatly increases throughput.

Thereafter, the supply of hydrogen gas for temperature stabilizing is suspended, and the supply of reactant gas and p-type doping gas for epitaxial growth is begun (as indicated by "step f"). The reactant gas is a compound of a Group IV element (silicon or germanium) with hydrogen, chlorine, or fluorine. It is exemplified by monosilane ($SiH_4$), disilane ($Si_2H_6$), monogermane ($GeH_4$), dichlorosilane ($SiH_2Cl_2$), trichlorosilane ($SiHCl_3$), and tetrachlorosilane ($SiCl_4$). Other gases may also be used in the same way. Illustration in this example is given for the process of forming a multilayered film of single-crystal silicon-germanium. A multilayered film of single-crystal silicon-germanium-carbon (which additionally contains carbon as a Group IV element) may be formed by incorporating the reactant gas with monomethylsilane ($CH_3SiH_3$), dimethylsilane (($CH_3$)$_2SiH_2$), trimethylsilane (($CH_3$)$_3SiH$), or the like. The p-type doping gas is exemplified by a compound of a Group III element with hydrogen, chlorine, or fluorine. A typical example is diborane ($B_2H_6$).

Figure 4:
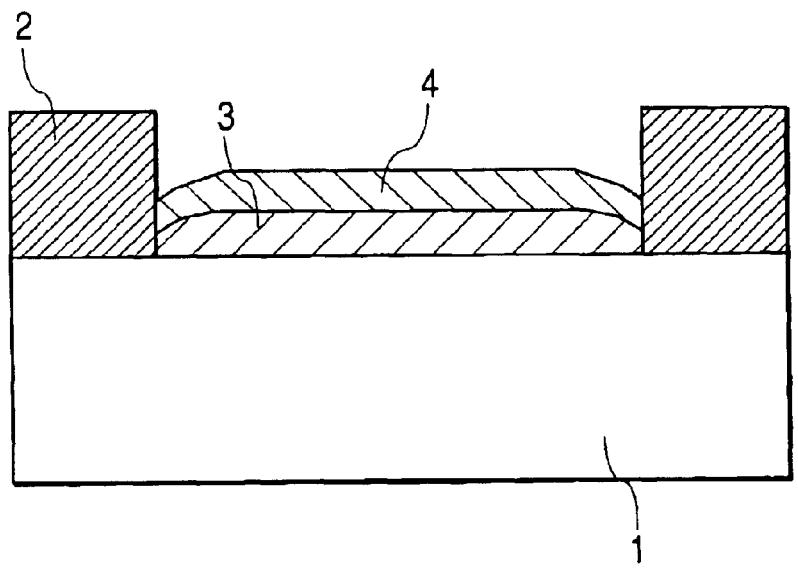
FIG. 4 is a sectional view showing the structure of the semiconductor device manufactured according to the growth sequence shown in FIG. 1.

FIG. 4 is a sectional view of the single-crystal layer resulting from selective epitaxial growth. There is shown a silicon oxide film 2 which functions as the masking material for selective epitaxial growth. There are also shown single-crystal silicon-germanium films 3 and 4 which are formed by epitaxial growth in the opening of the silicon oxide film 2 on the silicon substrate 1. During epitaxial growth, the following reaction takes place on the silicon oxide film 2:

$Si_2H_6 + 2SiO_2 \rightarrow 4SiO\uparrow + 3H_2\uparrow$ (for disilane ($Si_2H_6$) as the reactant gas)

$SiH_4 + SiO_2 \rightarrow 2SiO\uparrow + 2H_2\uparrow$ (for monosilane ($SiH_4$) as the reactant gas)

$SiH_2Cl_2 + SiO_2 \rightarrow 2SiO\uparrow + 2HCl\uparrow$ (for dichlorosilane ($SiH_2Cl_2$) as the reactant gas)

$GeH_4 + SiO_2 \rightarrow SiO\uparrow + GeO\uparrow + 2H_2\uparrow$ (for germane ($GeH_4$) as the reactant gas)

The above-mentioned reduction reaction is one of many reactions involved. There are other reactions to reduce the oxide film with active radical molecules resulting from the reactant gas by decomposition. As a result, two events occur simultaneously on the oxide film—etching by the reduction reaction and deposition resulting from the decomposition of the reactant gas. Whether etching or deposition proceeds faster depends on the growth temperature and pressure. The oxide film is limited in thickness to permit the desired selectivity by the above-mentioned reduction reaction alone. Therefore, in the case where a comparatively thick single-crystal silicon film or single-crystal silicon-germanium film is to be formed by epitaxial growth, the reactant gas is incorporated with a halogen gas such as chlorine ($Cl_2$) or a halide gas such as hydrogen chloride gas (HCl), so that etching is performed on the silicon layer itself as represented by the following reactions:

$Si + 2Cl_2 \rightarrow SiCl_4\uparrow$ $Si + 2HCl \rightarrow SiH_2Cl_2\uparrow$ So long as the selectivity is maintained as a result of the above-mentioned reactions proceeding simultaneously, no deposition of silicon-germanium takes place on the silicon oxide film.

Figure 5:
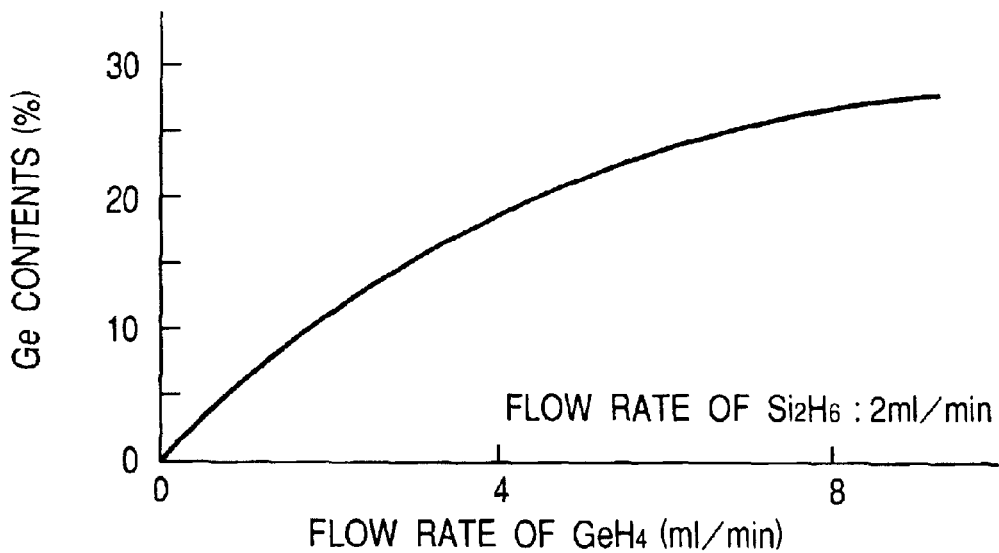
FIG. 5 is a graph showing the relationship between the germane flow rate and the germanium content in the growth of single-crystal silicon-germanium that employs disilane.
Figure 6:
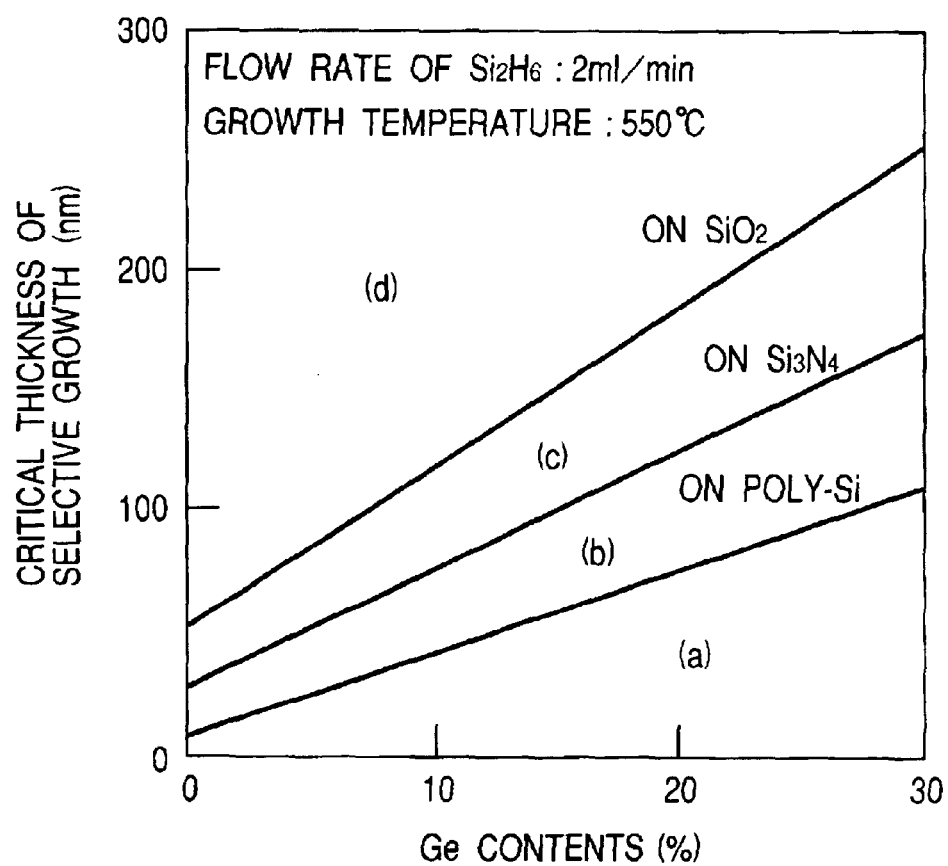
FIG. 6 is a graph showing the relationship between the germanium content and the maximum film thickness that can be formed on the silicon substrate without deposition on other materials, in the selective growth of single-crystal silicon-germanium that employs disilane.

FIG. 5 shows the relationship between the germanium content and the flow rate of germane in epitaxial growth under the condition that the epitaxial growth temperature is 550° C., the epitaxial growth pressure is 1 Pa, and the flow rate of disilane is 2 mL/min. It is noted that a germanium content of 15% is achieved if the flow rate of germane is about 3 mL/min. FIG. 6 shows the relationship between the germanium content and the maximum film thickness that permits the desired selectivity for the oxide film. It is noted that the film thickness should be smaller than about 150 nm for a germanium content of 15% so that the single-crystal silicon-germanium film is formed in the opening of the oxide film. If a single-crystal silicon-germanium film with a germanium content of 15% is to be formed, it is possible to maintain the desired selectivity by incorporation with a halide gas. For example, with HCl at a flow rate of 5–10 mL/min, it is possible to prevent polycrystalline silicon-germanium from depositing on the silicon oxide film or silicon nitride film. HCl at a flow rate below that specified above disturbs selectivity, allowing deposition of polycrystalline silicon-germanium.

Figure 7:
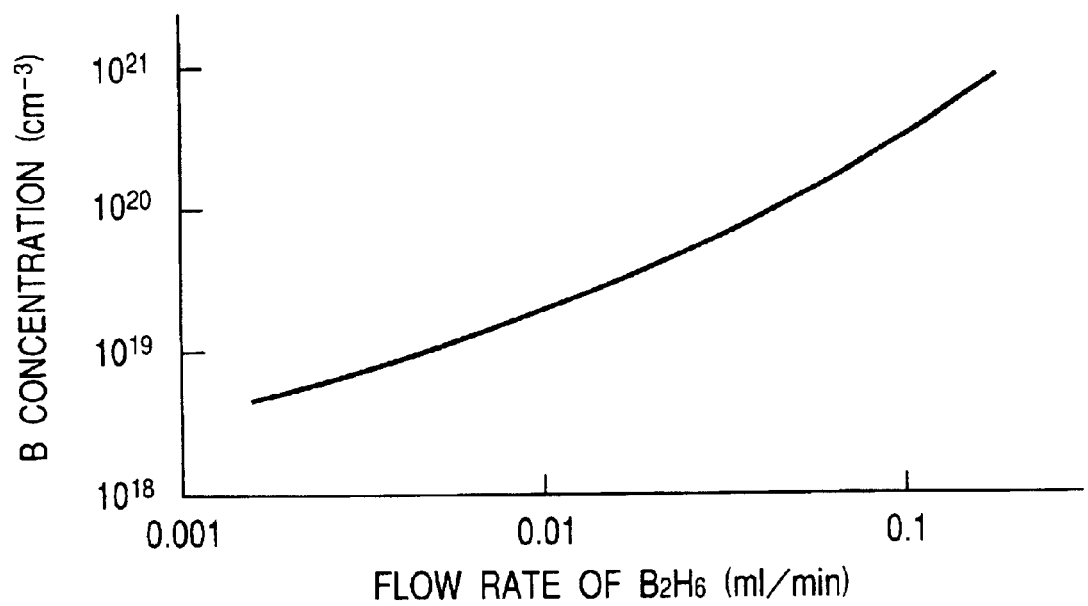
FIG. 7 is a graph showing the relationship between the diborane flow rate and the boron concentration in the growth of single-crystal silicon-germanium that employs disilane.

Conversely, HCl at a flow rate above that specified above deteriorates the surface morphology of the single-crystal silicon-germanium film. The temperature for epitaxial growth ranges from 500° C. to 800° C., so that desirable selectivity is obtained between the single-crystal silicon and the silicon oxide film or silicon nitride film, and a desirable surface morphology is attained. In this temperature range, the growth pressure ranges from 0.1 Pa (at which the growth rate is determined by the surface reaction) to 100 Pa (at which reactions in the gas phase begin). These conditions are applicable to the selective epitaxial growth of single-crystal silicon-germanium in the examples explained below. The doping concentration may be controlled by the flow rate of doping gas. FIG. 7 shows the relationship between the flow rate of diborane and the boron concentration. It is noted that a flow rate of 0.01 mL/min is adequate for doping of $1 \times 10^{19}$ cm$^{-3}$.

To complete the formation of the p-type layer in growth chamber 1, the supply of the reactant gas and doping gas is suspended, and the growth chamber 1 is then evacuated and the substrate temperature is lowered. While the substrate temperature is being lowered, the growth chamber 1 should preferably be supplied with clean hydrogen gas to protect the substrate surface from contamination in the same way as adopted after the substrate surface has been cleaned (as indicated by "step g" in FIG. 1).

The substrate may be transferred from one growth chamber directly to another growth chamber. However, for epitaxial growth with a high throughput, it is recommended that a transfer chamber be installed between two growth chambers for p-type doping and n-type doping, as shown in FIG. 2. While the substrate is being transferred from the growth chamber 1 to the growth chamber 2 through the transfer chamber, the growth chamber 2 and the transfer chamber are also supplied with clean hydrogen gas so as to protect the substrate surface from contamination. The supply of hydrogen gas may be interrupted for a short time, say about 10 minutes, without the possibility of contamination, because the terminating hydrogen atoms on the substrate surface remain stable while the substrate temperature is low. This is true in the case where the degree of vacuum is lower than $1 \times 10^{-7}$ Pa in the growth chamber and transfer chamber and the substrate temperature is lower than room temperature.

While the substrate is being transferred from growth chamber 1 to the transfer chamber, it is necessary to keep the two chambers at the same pressure; otherwise, the hydrogen gas rapidly flows from one chamber to the other when the gate valve is opened, and the increased hydrogen flow would displace the substrate support and stir up particles. Likewise, growth chamber 2 and the transfer chamber should be supplied with hydrogen gas so that they are kept at the same pressure.

The substrate is transferred from the transfer chamber to growth chamber 2 (as indicated by "step h" in FIG. 1). Growth chamber 2 is supplied with hydrogen gas containing atomic hydrogen as in the case of substrate surface cleaning. The substrate surface readily combines with active hydrogen atoms, and hence, the substrate surface is terminated with hydrogen effectively despite the low substrate temperature. The result is that the substrate surface is protected from contamination while the substrate is being transferred and held, with growth interrupted. This improves the crystalline properties of the multilayered film. The procedure for supplying hydrogen gas containing atomic hydrogen while the substrate is being transferred is employed also in the examples explained below.

Growth chamber 2, with the substrate placed therein, is supplied with clean hydrogen gas continuously. The substrate temperature is raised for epitaxial growth (as indicated by "step i" in FIG. 1). The supply of hydrogen gas follows the same way as used to clean the substrate surface in growth chamber 1. The substrate is transferred to growth chamber 2 such that the surface of the p-type single-crystal silicon-germanium layer grown in growth chamber 1 is kept clean. This eliminates the necessity of cleaning the substrate surface before the n-type single-crystal silicon-germanium layer is grown in growth chamber 2. As the result, there is no need for treatment at temperatures higher than the epitaxial growth temperature. This eliminates the diffusion of dopant from the p-type single-crystal silicon-germanium layer formed in growth chamber 1 and the diffusion of dopant from the silicon substrate. This also prevents the crystallinity from being deteriorated by dislocations and defects.

After the substrate temperature has reached the temperature for epitaxial growth in growth chamber 2, the flow rate of hydrogen gas is made equal to that of all gases for epitaxial growth. The substrate is allowed to stand for a while until the substrate temperature becomes stable (as indicated by "step j" in FIG. 1). As in the procedure adopted prior to the start, of growth in growth chamber 1, it is also possible to stabilize the substrate temperature while heating the substrate and controlling the flow rate of hydrogen gas. This contributes to improvement in throughput.

After the substrate temperature has been stabilized, the supply of hydrogen gas is suspended and switched to the supply of reactant gas and n-type doping gas, so as to start forming the second semiconductor layer (as indicated by "step K" in FIG. 1). The n-type doping gas is exemplified by compounds of a Group V element with hydrogen, chlorine, or fluorine. It includes phosphine ($PH_3$) and arsine ($AsH_3$) The condition for selective growth is the same as that used to form the single-crystal p-type silicon-germanium layer. If necessary, a halogen-based gas may also be used in combination with these gases for improved selectivity. The supply of reactant gas and n-type doping gas is suspended to stop growing the n-type silicon-germanium layer. At the same time, the substrate temperature is lowered (as indicated by "step l" in FIG. 1). The substrate is transferred to the load-lock chamber through the transfer chamber. Finally, the substrate is removed from the production equipment (as indicated by "step m" in FIG. 1).

The process according to this example yields a semiconductor multilayered film comprised of single-crystal layers differing in conductivity type, which has improved crystallinity. This occurs because the process permits accurate doping control and prevents contamination and formation of oxide film between layers constituting the multilayered film when the multilayered film is formed in the opening of the insulating film. In addition, the process does not need cleaning and annealing while the multilayered film is being formed. This means that there is no possibility of dopant redistribution due to heat diffusion. The result is formation of thin junction with high concentrations. A semiconductor device with this structure exhibits improved performance such as high speed and low resistance.

The explanation in this example has been made for the process of growing a silicon-germanium layer doped in n-type and then growing a silicon-germanium layer doped in p-type. The same explanation applies to any process of forming a multilayered film of other constructions by using growth chamber 1 for p-type doping and growth chamber 2 for n-type doping.

An exemplary resulting multilayered film was examined for contamination in the interface between one single-crystal layer and the other. It was found that the concentration of oxygen is no higher than $5 \times 10^{18}$ cm$^{-3}$ and the concentration of carbon is no higher than $5 \times 10^{17}$ cm$^{-3}$.

EXAMPLE 2

Figure 8:
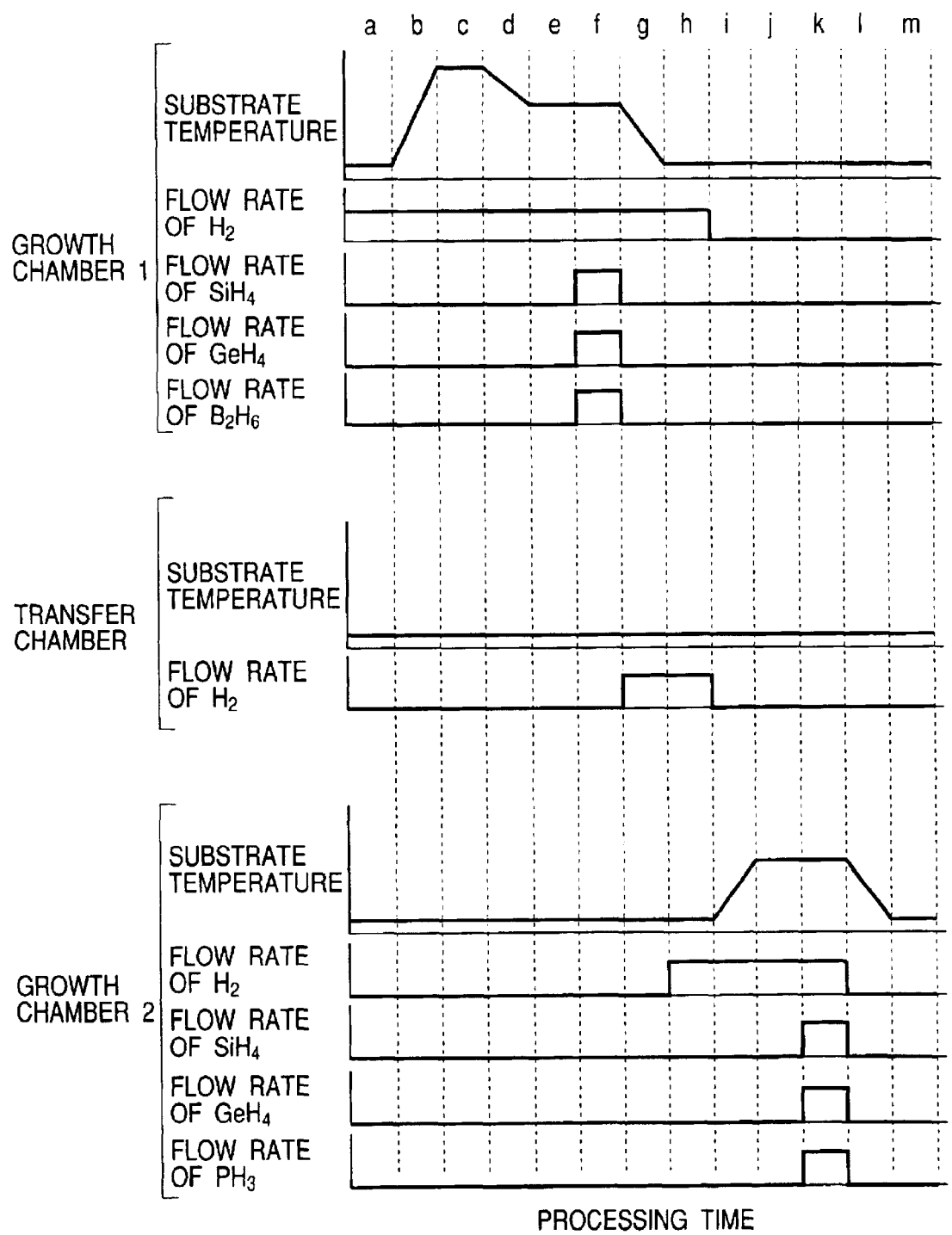
FIG. 8 is a diagram showing the growth sequence in a second example for the fabrication of a semiconductor device according to the present invention.

This example demonstrates a second process for fabricating a semiconductor device according to the present invention. The process follows the growth sequence shown in FIG. 8. The growth sequence is a graphical representation of the substrate temperature and gas flow rate as the values change over time (in consecutive steps) when a multilayered film comprising a single-crystal silicon-germanium layer doped in p-type and a single-crystal silicon-germanium layer doped in n-type is selectively formed in an opening of an insulating film.

The sequence in this example differs from that in Example 1 in temperature, gas flow rate, and pressure for epitaxial growth, such that the growth time is reduced by raising the growth temperature. This example is characterized by using hydrogen as a carrier gas in combination with the reactant gas and doping gas in order to raise the growth temperature. This is indicated by "step f" and "step k" in FIG. 8. The reactant gas used in this example should preferably be monosilane or dichlorosilane in combination with germane which undergoes uniform reaction at a high growth temperature. A multilayered film of single-crystal silicon-germanium-carbon (which additionally contains carbon) may be formed by incorporating the reactant gas with monomethylsilane (as a reactant gas for carbon) in the same way as in Example 1.

Figure 9:
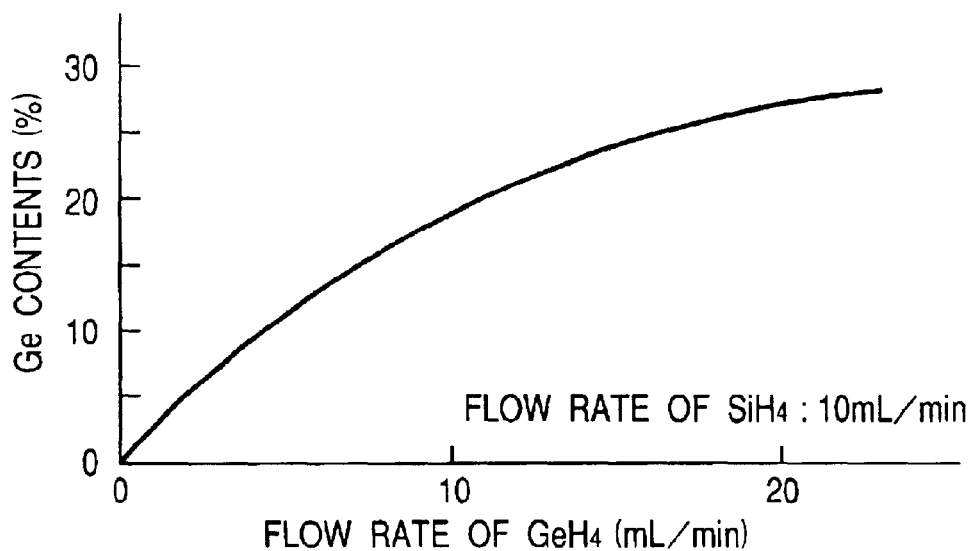
FIG. 9 is a graph showing the relationship between the germane flow rate and the germanium content in the growth of single-crystal silicon-germanium that employs monosilane.
Figure 10:
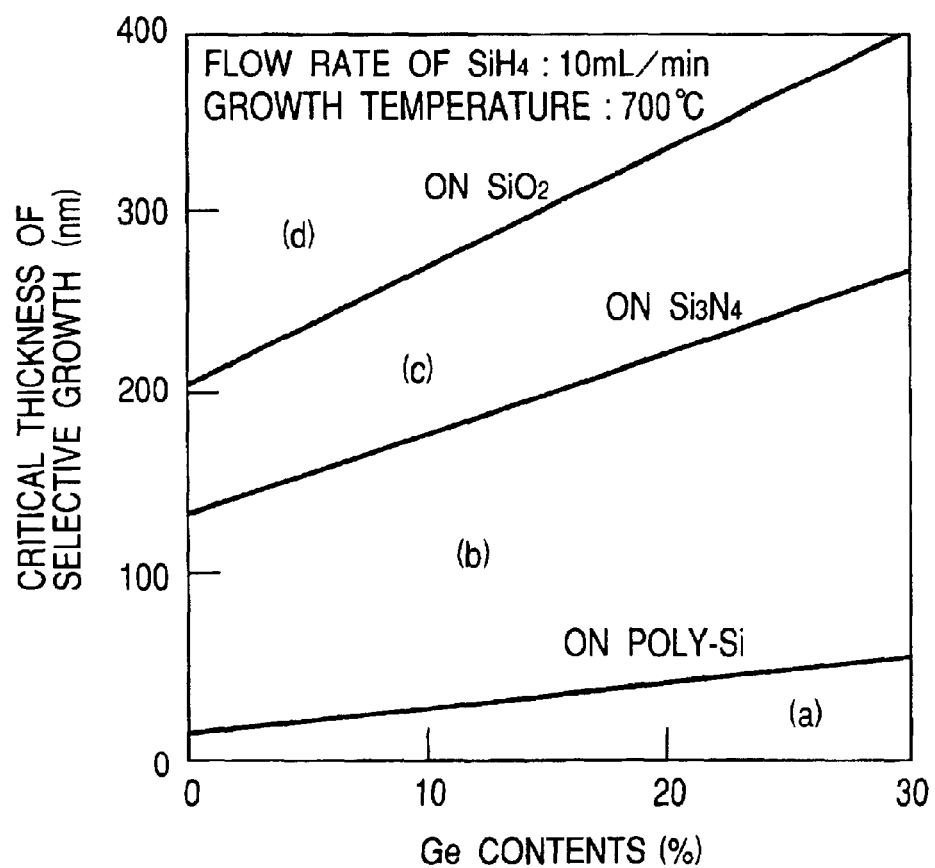
FIG. 10 is a graph showing the relationship between the germanium content and the maximum film thickness that can be formed on the silicon substrate without deposition on other materials, in the selective growth of single-crystal silicon-germanium that employs monosilane.

FIG. 9 shows the relationship between the germane flow rate and the germanium content under the condition that the epitaxial growth temperature is 700° C., the growth pressure is 1000 Pa, the hydrogen flow rate is 10 L/min, and the monosilane flow rate is 10 mL/min. It is noted from FIG. 9 that a germanium content of 15% is obtained when the germane flow rate is about 8 mL/min. FIG. 10 shows the relationship between the germanium content and the maximum film thickness that permits the desired selectivity for the oxide film. It is noted that the film thickness should be smaller than 300 nm for a germanium content of 15% so that the single-crystal silicon-germanium film is selectively formed in the opening of the oxide film.

If a single-crystal silicon-germanium film with a germanium content of 15% and a thickness larger than 300 nm is to be formed, it is possible to maintain the desired selectivity by incorporation with a halide gas. For example, with HCl at a flow rate of 20–30 mL/min, it is possible to prevent polycrystalline silicon-germanium from depositing on the silicon oxide film or silicon nitride film. HCl at a flow rate below that specified above disturbs selectivity, allowing deposition of polycrystalline silicon-germanium. Conversely, HCl at a flow rate higher than specified above deteriorates the surface morphology of the single-crystal silicon-germanium film.

The temperature for epitaxial growth ranges from 600° C. (for thermal decomposition of monosilane) to 800° C. (for good surface morphology). In this temperature range, the growth pressure ranges from 10 Pa (at which the growth rate is determined by the surface reaction) to atmospheric pressure (for safe operation). These conditions are also applicable to the selective epitaxial growth of single-crystal silicon-germanium in the examples explained below.

In this example, the substrate is placed in clean hydrogen during both the cleaning step and the epitaxial growth step. Therefore, the substrate surface remains free of contaminants and native oxide film even though the degree of vacuum is not high (e.g., 1 Pa or less) in growth chamber 1, growth chamber 2, the transfer chamber, and the load-lock chamber of the semiconductor production equipment shown in FIG. 2. This offers the advantage, in addition to the advantages of Example 1, of greatly reducing the period of time that precedes epitaxial growth, thereby improving throughput. Also the low degree of vacuum obviates the necessity of installing an expensive evacuating machine for a high vacuum, and this greatly reduces the cost of the semiconductor production equipment. Moreover, the low degree of vacuum obviates the necessity of baking the equipment to maintain a high vacuum. This greatly reduces maintenance work.

EXAMPLE 3

Figure 11:
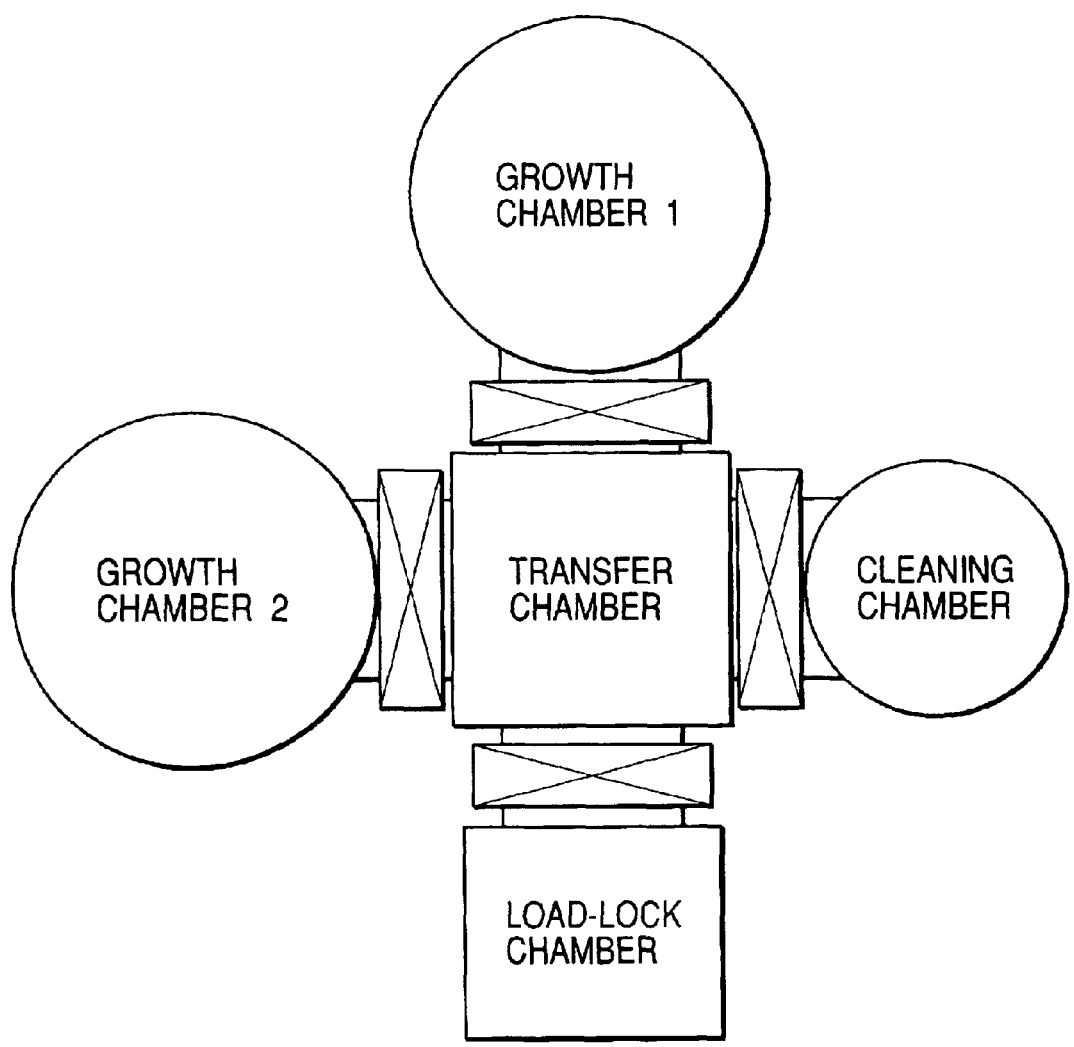
FIG. 11 is a schematic diagram showing the semiconductor production equipment used in one example of the present invention.

This example employs the semiconductor production equipment shown in FIG. 11. This equipment differs from that in Examples 1 and 2 in that it has a cleaning chamber separate from growth chambers 1 and 2. This cleaning chamber is used to clean the substrate surface prior to epitaxial growth. In the case where the cleaning chamber is added to the equipment used in Example 1, the degree of vacuum in the cleaning chamber should be high, e.g., $1 \times 10^{-5}$ Pa or less, so as to protect the substrate surface from contamination. In the case where the cleaning chamber is added to the equipment used in Example 2, the degree of vacuum in the cleaning chamber should be 1 Pa or less.

The process according to this example enables simultaneous cleaning and epitaxial growth on a plurality of substrates. The result is a greatly improved throughput.

EXAMPLE 4

This example demonstrates a third process for fabricating a semiconductor device according to the present invention. The process follows the growth sequence shown in FIG. 12. The growth sequence is a graphical representation of the substrate temperature and gas flow rate as the values change over time (in consecutive steps) when a multilayered film comprising a single-crystal silicon-germanium layer doped in p-type and a single-crystal silicon-germanium layer doped in n-type is selectively formed in an opening of an insulating film.

Figure 12:
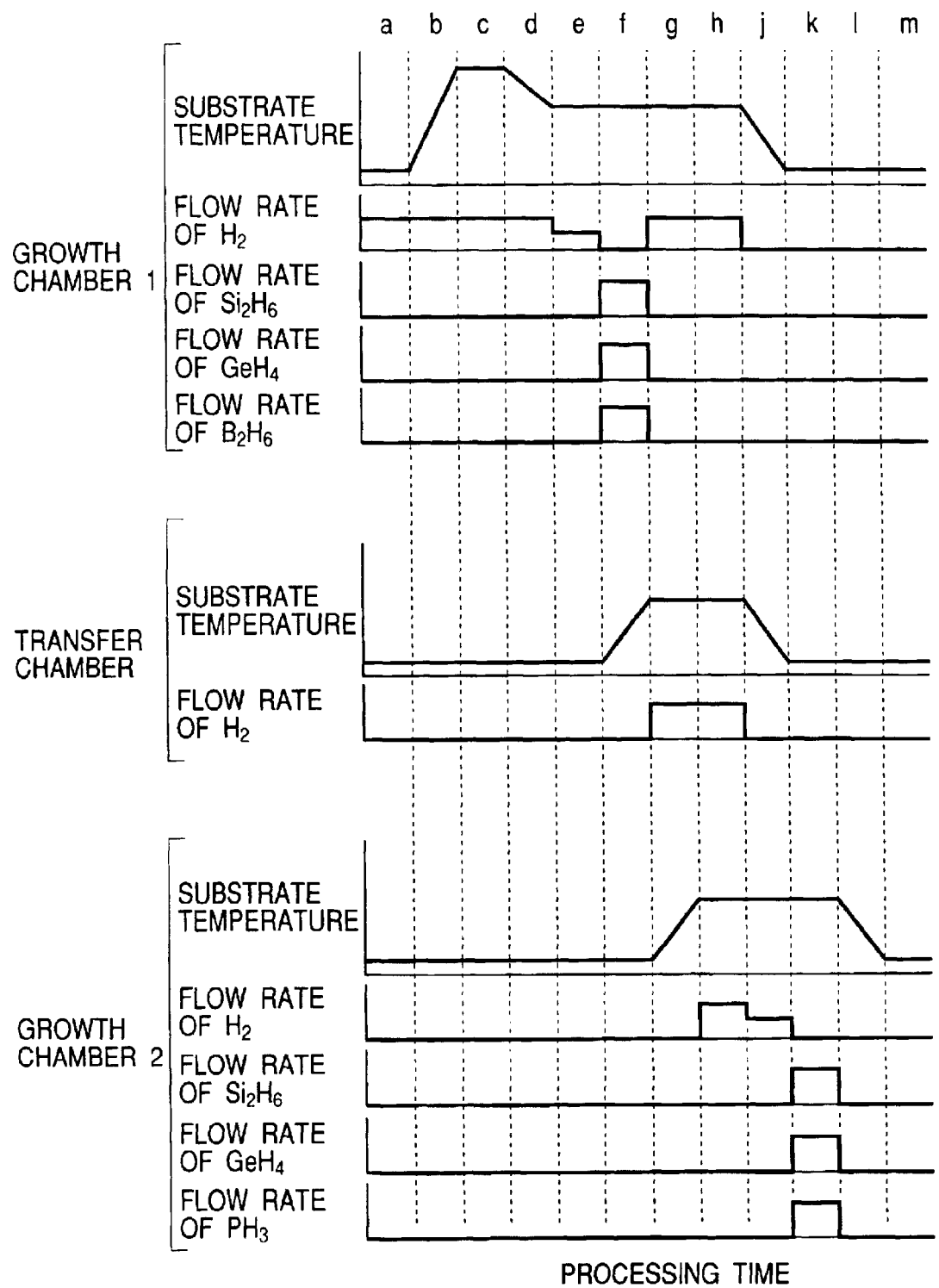
FIG. 12 is a diagram showing the growth sequence in a third example for the fabrication of a semiconductor device according to the present invention.

The sequence in this example differs from that in Example 1 in that after the p-type single-crystal silicon-germanium layer has been formed, the substrate is transferred to growth chamber 2 through the transfer chamber, with the substrate temperature maintained by the heating apparatus installed in the transfer chamber (as indicated by "step h" in FIG. 12). Transfer in this manner eliminates the time required to lower the temperature after the p-type single-crystal silicon-germanium layer has been grown and also eliminates the time required to reheat the layers to the temperature for epitaxial growth after transfer to growth chamber 2. This contributes to an improvement in throughput.

Raising and lowering the substrate temperature repeatedly in a short time period between room temperature and 500° C. (or above) for epitaxial growth cause substrates (larger than 8 inches in diameter) to warp on account of an uneven temperature distribution in the substrate. Warped substrates prevent accurate placement after epitaxial growth and accurate mask alignment in photolithography. This problem is avoided in the process of this example by maintaining the substrate temperature nearly at the epitaxial growth temperature. In this way it is possible to greatly reduce stress in the substrate and to eliminate the problem of warpage.

Ideally, it is desirable to maintain the substrate temperature constant throughout transfer. In practice, however, it is difficult to keep the temperature of a substrate being transferred constant. The desired effect is produced if the substrate temperature is kept above 100° C. after epitaxial growth at 500° C. The change in substrate temperature within this range does not cause warpage to the substrate. Thus, the process according to this example increases throughput in formation of semiconductor multilayered film. It also greatly improves yields of semiconductor devices having a semiconductor multilayered film.

EXAMPLE 5

This example demonstrates a fourth process for fabrication of a semiconductor device according to the present invention. The process follows the growth sequence shown in FIG. 13. The growth sequence is a graphical representation of the substrate temperature and gas flow rate as the values change over time (in consecutive steps) when a multilayered film comprised of a single-crystal silicon-germanium layer doped in p-type and a single-crystal silicon-germanium layer doped in n-type is selectively formed in an opening of an insulating film. The sequence in this example differs from that in Example 1 in that after the p-type single-crystal silicon-germanium layer and the n-type single-crystal silicon-germanium layer have been formed, growth chamber 1 and growth chamber 2 are cleaned (as indicated by "steps f and k" in FIG. 13).

Figure 13:
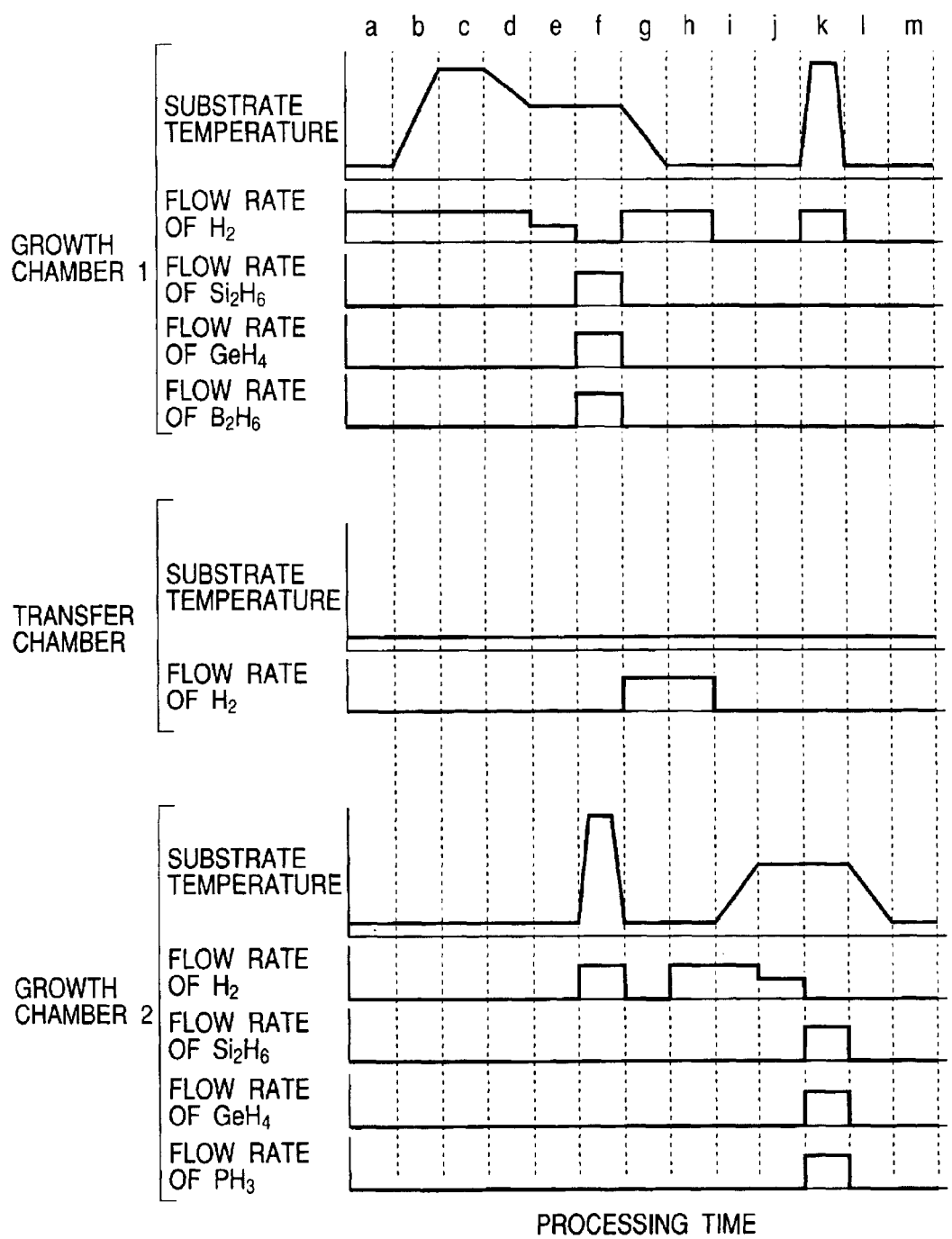
FIG. 13 is a diagram showing the growth sequence in a fourth example for the fabrication of a semiconductor device according to the present invention.

In forming a multilayered film comprised of a p-type single-crystal silicon-germanium layer and an n-type single-crystal silicon-germanium layer on a plurality of substrates, the process is carried out such that while the p-type single-crystal silicon-germanium layer is being formed in growth chamber 1, growth chamber 2 is cleaned (as indicated by "step f" in FIG. 13). This cleaning step is intended to remove the n-type dopant remaining in growth chamber 2 in which n-type doping has just been carried out. Similarly, the process is also carried out such that while the n-type single-crystal silicon-germanium layer is being formed in growth chamber 2, growth chamber 1 is cleaned (as indicated by "step k" in FIG. 13). The cleaning of the growth chambers may be carried out at any time when the substrate is not in the growth chamber being cleaned. It is not always necessary to perform cleaning while epitaxial growth is being made in one of the growth chambers.

Cleaning may be accomplished by heating the growth chamber which has been evacuated or which is being supplied with hydrogen gas, $Cl_2$, HCl, or a similar gas. Heating may be accomplished by a heating means which is designed to heat the growth chamber or the substrate. In the case where cleaning is carried out in the presence of hydrogen gas, the flow rate of hydrogen gas should be higher than 10 mL/min for uniform supply and lower than 100 L/min for safe exhaust disposal. The partial pressure of hydrogen should be higher than 10 Pa for uniform supply and lower than atmospheric pressure for safe operation.

The temperature of the growth chamber being cleaned varies depending on the arrangement of the heating mechanism and the material, shape, and position of the growth chamber. The cooled part of the growth chamber is less likely to be subject to dopant deposition during epitaxial growth, and hence, it can be readily cleaned at a low temperature. That part of the growth chamber which is made of stainless steel and cooled with water or any other coolant is less likely to be subject to dopant deposition during epitaxial growth. In this case cleaning may be accomplished by heating at 50° C. or above. The upper limit of heating is 250° C. at which there is the possibility of leakage in the vacuum chamber due to expansion of stainless steel.

On the other hand, that part of the growth chamber which is not cooled during epitaxial growth is subject to thick deposition with dopant as well as silicon and germanium. Therefore, it should be cleaned at a comparatively high temperature. For example, the quartz susceptor to hold substrates should be cleaned at 200° C. or above. The effect of cleaning greatly varies depending on the temperature, and the time required for heating varies depending on temperature. It is desirable to complete the cleaning process in a short time at a high temperature so as to maintain the throughput. For example, the heating time is about 10 minutes for heating at about 1000° C. for the hottest part.

HCl as a cleaning gas produces the same effect as hydrogen gas at a lower temperature. For example, HCl at a flow rate of 50 mL/min and a pressure of 100 Pa can clean a quartz susceptor at about 500° C. for about 10 minutes. $ClF_3$ as a cleaning gas at a pressure above 10 Pa can clean silicon and any dopant which has deposited in the growth chamber because it etches silicon even at room temperature. Cleaning with a halide gas such as $ClF_3$ requires careful moisture control and periodic pipe replacement because of the possibility of corrosion on metal parts. The process according to this example removes residual dopant remaining in the growth chamber after doping. Therefore, it reduces the dopant concentration in the grown single-crystal silicon-germanium layer without supplying a doping gas.

EXAMPLE 6

Figure 14:
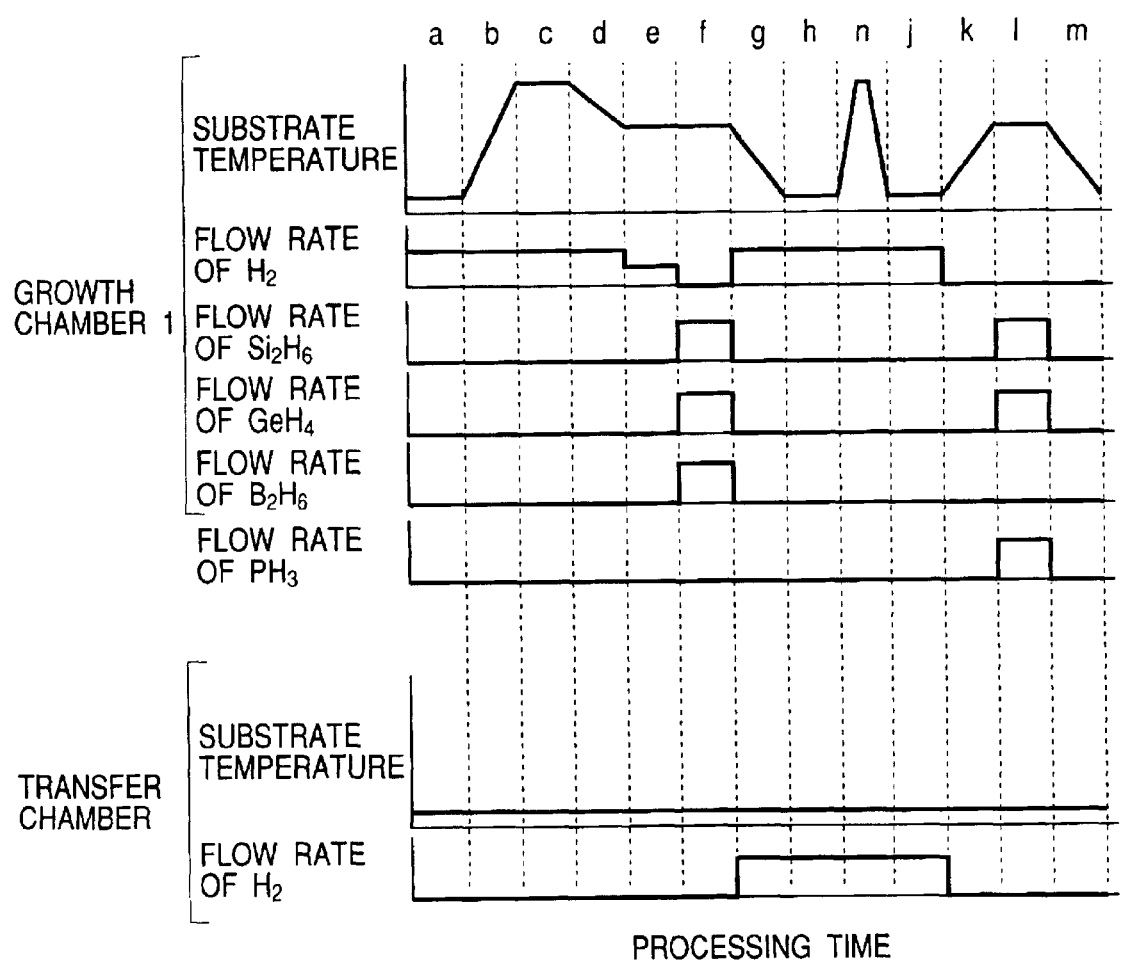
FIG. 14 is a diagram showing the growth sequence in a fifth example for the fabrication of a semiconductor device according to the present invention.
Figure 15:
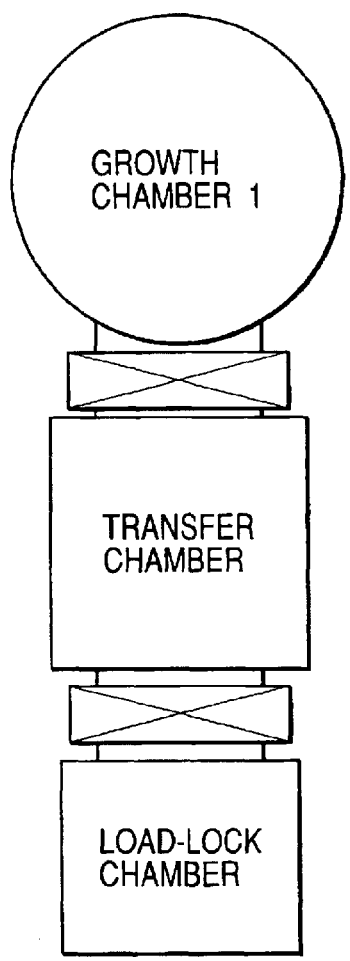
FIG. 15 is a schematic diagram showing the semiconductor production equipment used in one example of the present invention.

This example demonstrates a fifth process for fabricating a semiconductor device according to the present invention. The process follows the growth sequence shown in FIG. 14. The growth sequence is a graphical representation of the substrate temperature and gas flow rate as the values change with time (in consecutive steps) when a multilayered film comprising a single-crystal silicon-germanium layer doped in p-type and a single-crystal silicon-germanium layer doped in n-type is selectively formed in an opening of an insulating film. FIG. 15 shows semiconductor production equipment necessary to practice the process of this example.

The sequence in this example differs from that in Example 5 in that both the p-type single-crystal silicon-germanium layer and the n-type single-crystal silicon-germanium layer are formed in the same growth chamber. In the case where doping for different conductivity types is carried out continuously in the same growth chamber, it is difficult to control the doping concentration because residual unnecessary dopant is captured. Moreover, residual dopant prevents the adsorption of gas on the surface of crystal growth, thereby retarding uniform crystal growth and deteriorating the crystalline properties of the epitaxial layer. To avoid this trouble, it is necessary to remove the substrate from the growth chamber and return it to the growth chamber after cleaning, if growth is to be carried out for different conductivity types. In this case, the substrate should be transferred in an atmosphere of clean hydrogen so that the substrate surface is protected from oxide film and contamination. This procedure is the same as that mentioned in Example 1.

The process in this example comprises forming a p-type single-crystal silicon-germanium layer ("step f" in FIG. 14), transferring the substrate to the transfer chamber through a hydrogen atmosphere ("step h"), and cleaning the growth chamber ("step n"). Cleaning of the growth chamber is carried out under the same conditions as in Example 5. After cleaning, the substrate is again placed in the growth chamber ("step j") and the n-type single-crystal silicon-germanium layer is formed ("step l").

The process of this example makes it possible to remove residual dopant remaining in the growth chamber after doping even though only one growth chamber is available. Therefore, it produces the same effect as in Example 5 as well as the effect of greatly reducing the cost of the epitaxial growth equipment to form a multilayered film with different dopants.

EXAMPLE 7

Figure 16:
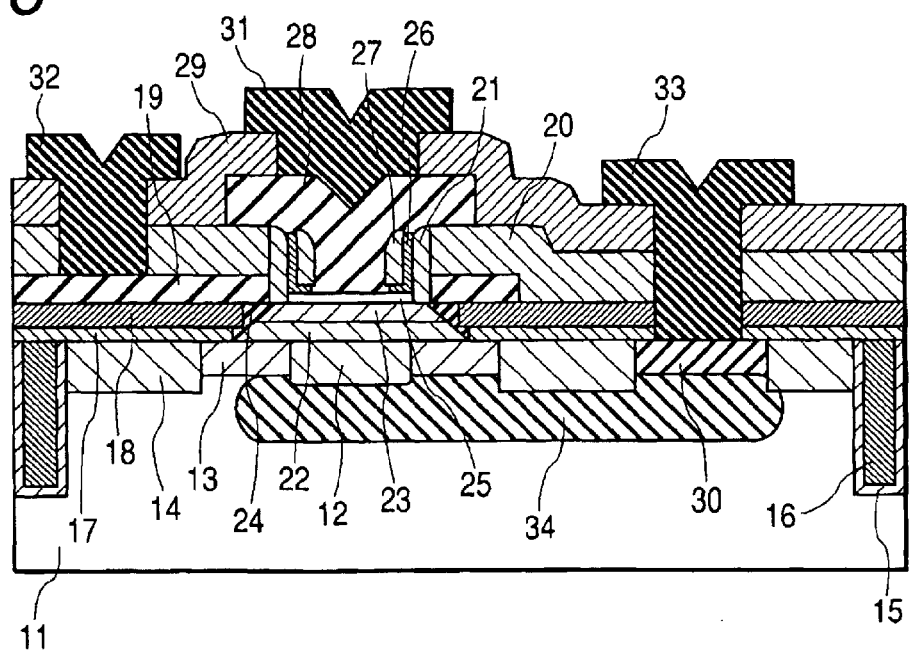
FIG. 16 is a sectional view showing the structure of the semiconductor device in one example of the present invention.

This example demonstrates the semiconductor multilayered structure of the present invention which is applied to the collector-base-emitter layer of a bipolar transistor. A sectional view of the structure is shown in FIG. 16. There is shown a silicon substrate 11. On this silicon substrate 11 are formed a heavily doped n-type silicon layer 12 (which functions as the collector) and a lightly doped n-type silicon layer 13. A collector-base insulating film 14 is formed in the part excluding the active region of the transistor. Trenches are formed by dry etching between transistors. On the inside wall of the trench is formed an insulating film 15. The trench is filled with an insulating film 16. Thus the isolation region is formed. On the collector-base isolating insulation films 17 and 18, the polycrystalline silicon layer 19 (which functions as the base lead electrode) and the emitter-base isolating insulation film 20 are formed.

The n-type silicon-germanium layer 22 (which becomes the lightly doped collector), the p-type silicon-germanium layer 23 (which becomes the intrinsic base), and the n-type silicon layer 25 (which becomes the emitter layer) are sequentially formed by epitaxial growth only on the lightly doped n-type silicon layer 13 in the, opening of the collector-base isolating insulation film 17. The heavily doped n-type polycrystalline silicon layer 28 (which becomes the emitter electrode) is formed, and then the insulating film 29 is deposited on the entire surface. An opening is made for the collector part. The heavily doped n-type polycrystalline silicon 30 (which becomes the collector lead electrode) is formed, and then the emitter electrode 31, the base electrode 32, and the collector electrode 33 are formed.

Figure 17A:
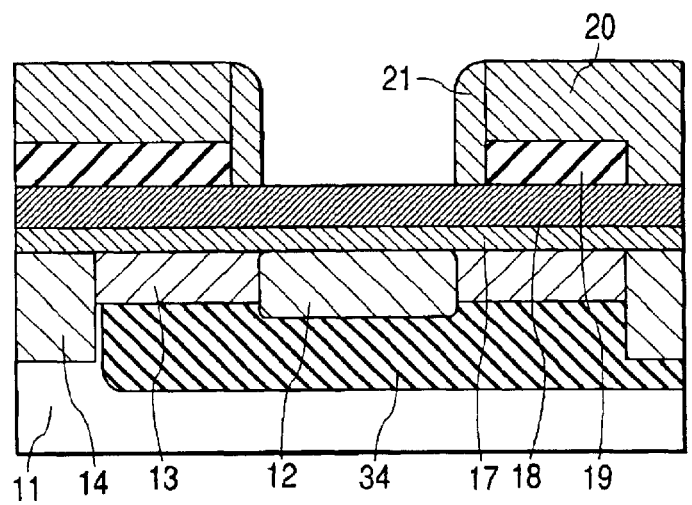
FIGS. 17(*a*) to 17(*c*) are partly enlarged sectional views showing the steps of manufacturing the semiconductor device shown in FIG. 16.
Figure 17B:
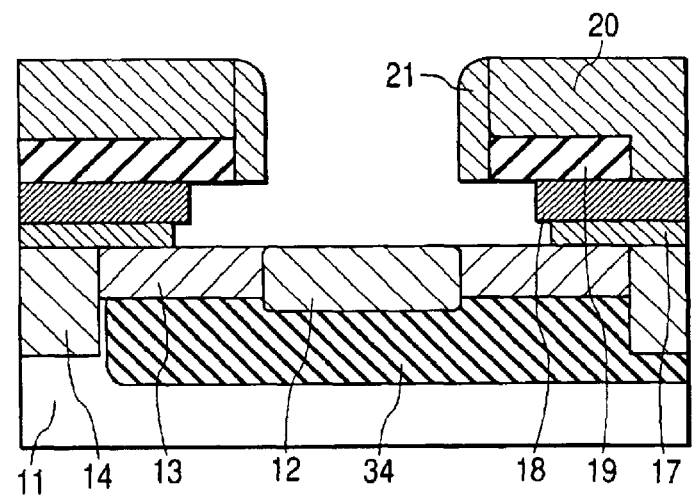
Figure 17C:
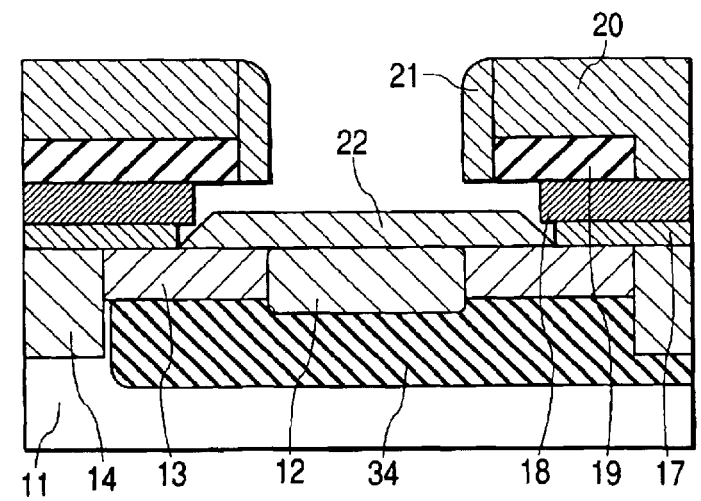
Figure 18A:
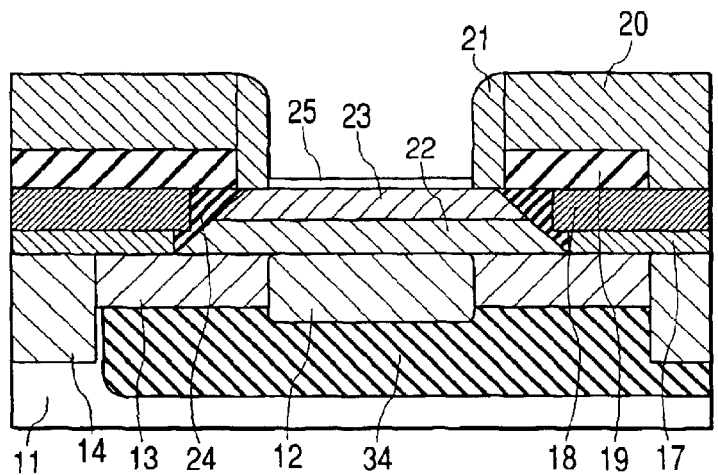
FIGS. 18(a) to 18(c) are partly enlarged sectional views showing the steps of manufacturing the semiconductor device shown in FIG. 16.
Figure 18B:
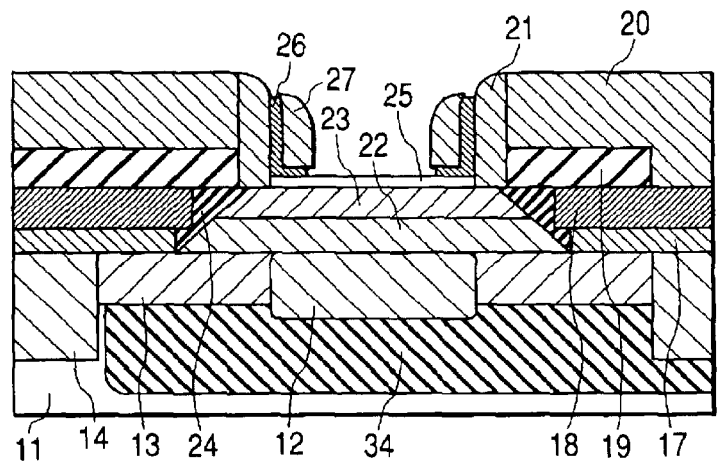

FIGS. 17 and 18 show the flow diagram for fabrication of the lightly doped collector layer, the intrinsic base layer, and the emitter layer which are necessary to realize the semiconductor integrated circuit constructed as shown in FIG. 16. First, the heavily doped single-crystal silicon layer 34 (which becomes the collector layer) is formed. The collector-base isolating insulation film 14 is then formed. The lightly doped n-type single-crystal silicon layer 13 (which becomes the lightly doped collector layer) is formed in the opening of the collector-base isolating insulation film 14. The silicon oxide film 17 and the silicon nitride film 18 (both of which become the collector-base isolating insulation film) are deposited. On these layers are formed the p-type polycrystalline silicon layer 19 (which becomes the base lead electrode) and the emitter-base isolating insulation film 20. An opening is made in the p-type polycrystalline silicon layer 19 and the emitter-base isolating insulation film 20. On the side wall of the opening is formed the emitter-base isolating insulation film 21.

The n-type collector region 12 is formed by ion implantation through the opening (see, FIG. 17(*a*)). Then, the collector-base isolating insulation films 18 and 19 are sequentially etched, so that the surface of the lightly doped n-type single-crystal silicon layer 13 is exposed (see, FIG. 17(*b*)). After wet cleaning, the wet-cleaned substrate is mounted in the epitaxial growth equipment. The surface of the lightly doped n-type single-crystal silicon layer 13 is cleaned. On the lightly doped n-type single-crystal silicon layer 13 is formed the lightly doped n-type single-crystal silicon-germanium layer 22 (see, FIG. 17(*c*)). On the lightly doped n-type single-crystal silicon-germanium layer 22 are sequentially formed the p-type single-crystal silicon-germanium layer 23 and the n-type single-crystal silicon layer 25 by epitaxial growth.

Figure 19:
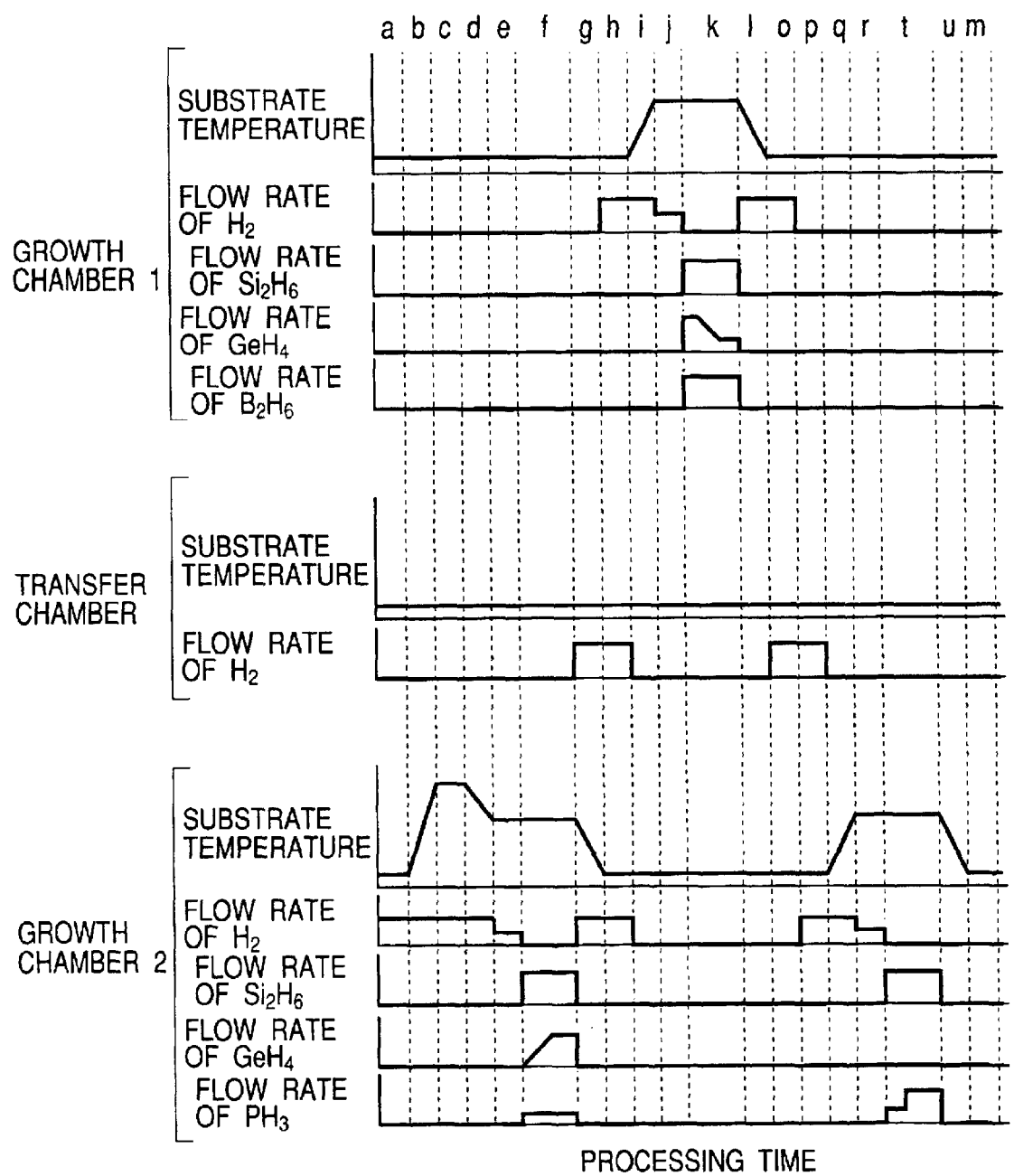
FIG. 19 is a diagram showing the growth sequence for the fabrication of the semiconductor device shown in FIG. 16.
Figure 20:
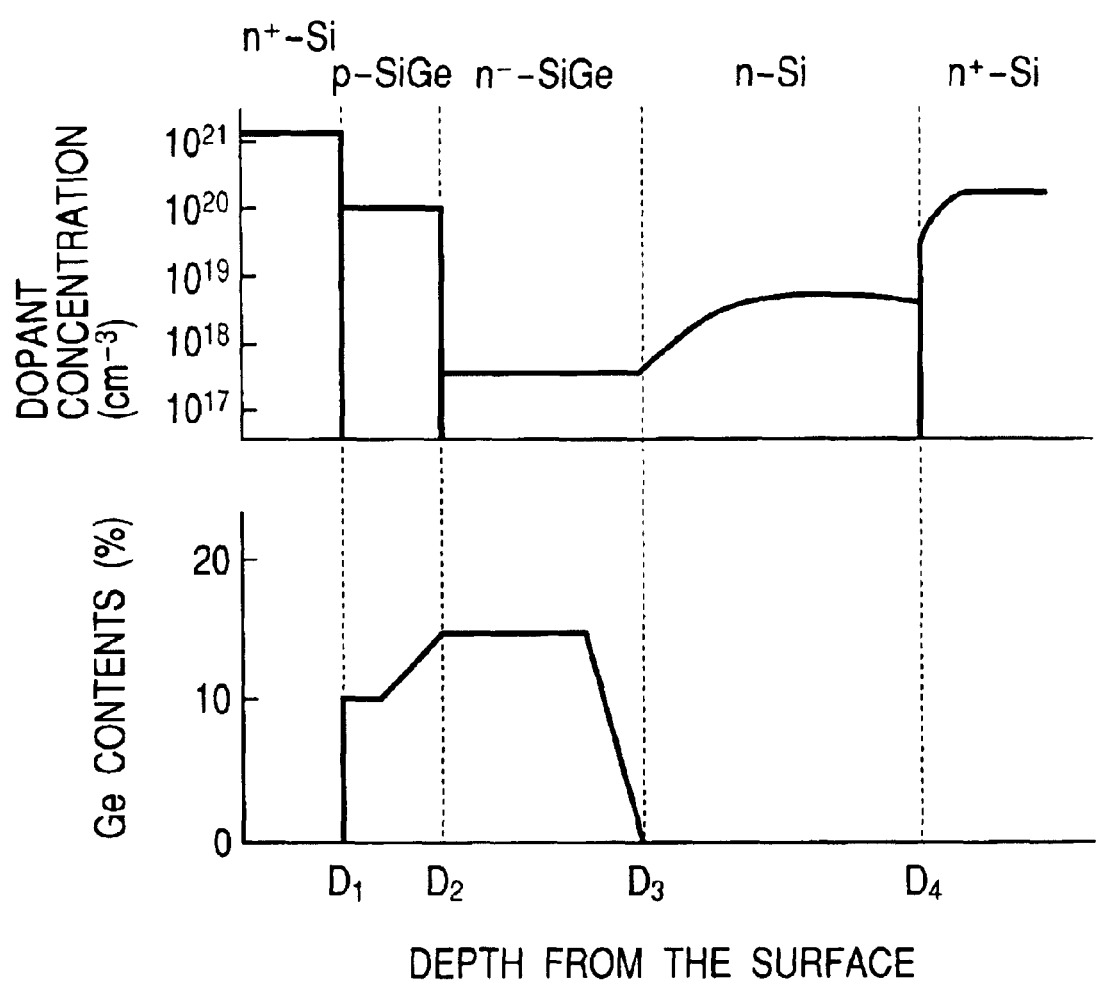
FIG. 20 is a graph showing the relationship between the dopant concentration and the profile of germanium content in the depthwise direction, in the semiconductor device shown in FIG. 16.

FIG. 19 shows the sequence of the epitaxial growth used to form the multilayered film comprised of the n-type silicon-germanium layer 22, the p-type silicon-germanium layer 23, and the n-type silicon layer 25. FIG. 20 shows the germanium content and the doping profile in the intrinsic part of the bipolar transistor.

As in Example 1, the silicon substrate is wet-cleaned to make its surface free of contamination, native oxide film, and particles, before it is mounted in the epitaxial growth chamber. With the substrate mounted, the preparation chamber is evacuated, and the substrate is transferred to growth chamber 2 through the transfer chamber ("step a" in FIG. 19). It is assumed that the substrate undergoes p-type doping in growth chamber 1 and n-type doping in growth chamber 2, as in Example 1. The substrate surface is cleaned in the growth chamber 2 ("step c"). The substrate is allowed to stand for a while so that the substrate temperature becomes stable ("step e"). The supply of hydrogen gas is suspended, and the supply of reactant gas and n-type doping gas is started, so that the n-type silicon-germanium layer (which becomes the lightly doped n-type collector) is formed ("step f"). The condition for epitaxial growth is the same as that in Example 1 for forming the n-type single-crystal layer.

As shown in FIG. 17(*c*), the lightly doped n-type silicon-germanium layer 22 should be formed such that the polycrystalline silicon-germanium layer does not deposit under the overhang of the p-type polycrystalline silicon layer 19 (which becomes the base lead electrode) In this way it is possible to prevent a low concentration layer from appearing between the intrinsic base and the base lead electrode and, hence, it is possible to reduce the resistance of the base lead part. Epitaxial growth in this manner is accomplished by reducing the flow rate of reactant gas (thereby reducing the growth pressure) and raising the growth temperature.

Thus, the single-crystal layer can be formed only on the silicon substrate because there is a great difference in growth start time and growth rate depending on the plane orientation between the single-crystal silicon substrate with (100) plane and the polycrystalline silicon with (311) plane and (111) plane. This is apparent from FIG. 6. It is to be noted that when a single-crystal layer (about 50 nm thick) with a germanium content of 15% is formed at a growth temperature of 550° C. from disilane and germane gas as the reactant gas, no polycrystalline silicon-germanium deposits under the p-type polycrystalline silicon.

In order to suppress the energy barrier between base and collector, it is necessary to also add germanium to the lightly doped collector layer in such a way that the germanium content increases in going from the substrate to the surface. This is accomplished by "step f" in FIG. 19. The flow rate of germane gas is increased from 0 to 4 mL/min while the flow rate of disilane gas is maintained constant at 2 mL/min. Thus, the germanium content in the depthwise region from D2 to D3 changes continuously from 0% to 15% in going from the silicon substrate to the surface, as shown in FIG. 20. As the result, the band gap continuously changes in the lightly doped n-type single-crystal silicon layer 13 and lightly doped n-type single-crystal silicon-germanium layer 22. Thus, the conduction band in the collector layer is free from the energy barrier. Incidentally, the doping concentration in the lightly doped silicon-germanium layer should preferably be lower than about $5 \times 10^{17}$ cm$^{-3}$ so that the collector-base breakdown voltage does not decrease and the collector-base capacity does hot increase.

Subsequently, the p-type single-crystal silicon-germanium layer 23 (which becomes the intrinsic base) is formed on the lightly doped n-type single-crystal silicon-germanium layer 22. In the region from D1 to D2 in the base layer, the germanium content should decrease in going from the substrate to the surface, as shown in FIG. 20. The result is that the conduction band in the base layer is graded in going from the emitter to the collector. The graded conduction band permits the electrons injected from the emitter to be accelerated in the base layer and also increases the Early voltage. Thus it is possible to increase the speed of the transistor and to improve the performance of the circuit containing the transistor. Simultaneously with the growth of the p-type single-crystal silicon-germanium layer 23, epitaxial growth is carried out in such a way that the polycrystalline p-type silicon-germanium 24 grows from the bottom of the overhangs of the p-type polycrystalline silicon 19 (which becomes the base lead electrode). In this way the intrinsic base is automatically connected to the base lead electrode.

Figure 18C:
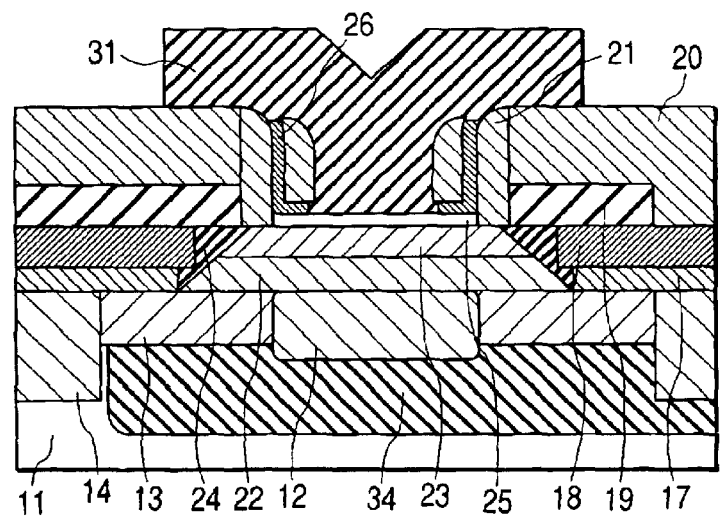

Thereafter, the n-type single-crystal silicon layer 25 (which becomes the emitter) is formed on the p-type single-crystal silicon-germanium layer 23. In the case where phosphorus is used as an n-type dopant, the dopant content should be higher than $1\times10^{19}$ cm$^{-3}$, and preferably higher than $1\times10^{20}$ cm$^{-3}$, so that the emitter resistance is not excessively high. The area of epitaxial growth for the emitter layer is not limited to the single-crystal silicon-germanium layer 23 in the opening, but epitaxial growth may be carried out over the entire surface. Thereafter, the heavily doped n-type polycrystalline silicon layer 31 (which becomes the emitter electrode) is formed, and the unnecessary part is removed by etching. The multilayered structure as shown in FIG. 18(c) is obtained.

This example makes it possible to form a thin intrinsic base layer with a high concentration, which contributes to high-speed high-performance bipolar transistors. In the case where the doping concentration in the base is $1\times10^{19}$ cm$^{-3}$, the bipolar transistor formed by the process in this example does not need heat treatment at high temperatures after epitaxial growth. Therefore, it is possible to realize a base width with a thickness of approximately 15 nm while maintaining a base doping concentration of $1\times10^{19}$ cm$^{-3}$. Therefore, this transistor has a cutoff frequency of about 150 GHz. In addition, since the doping concentration in the base layer is high, it is possible to reduce the base resistance, to reduce the collector-base capacity due to selective growth, to greatly improve the maximum oscillation frequency of the bipolar transistor, and to reduce a noise figure of transistor.

EXAMPLE 8

Figure 21:
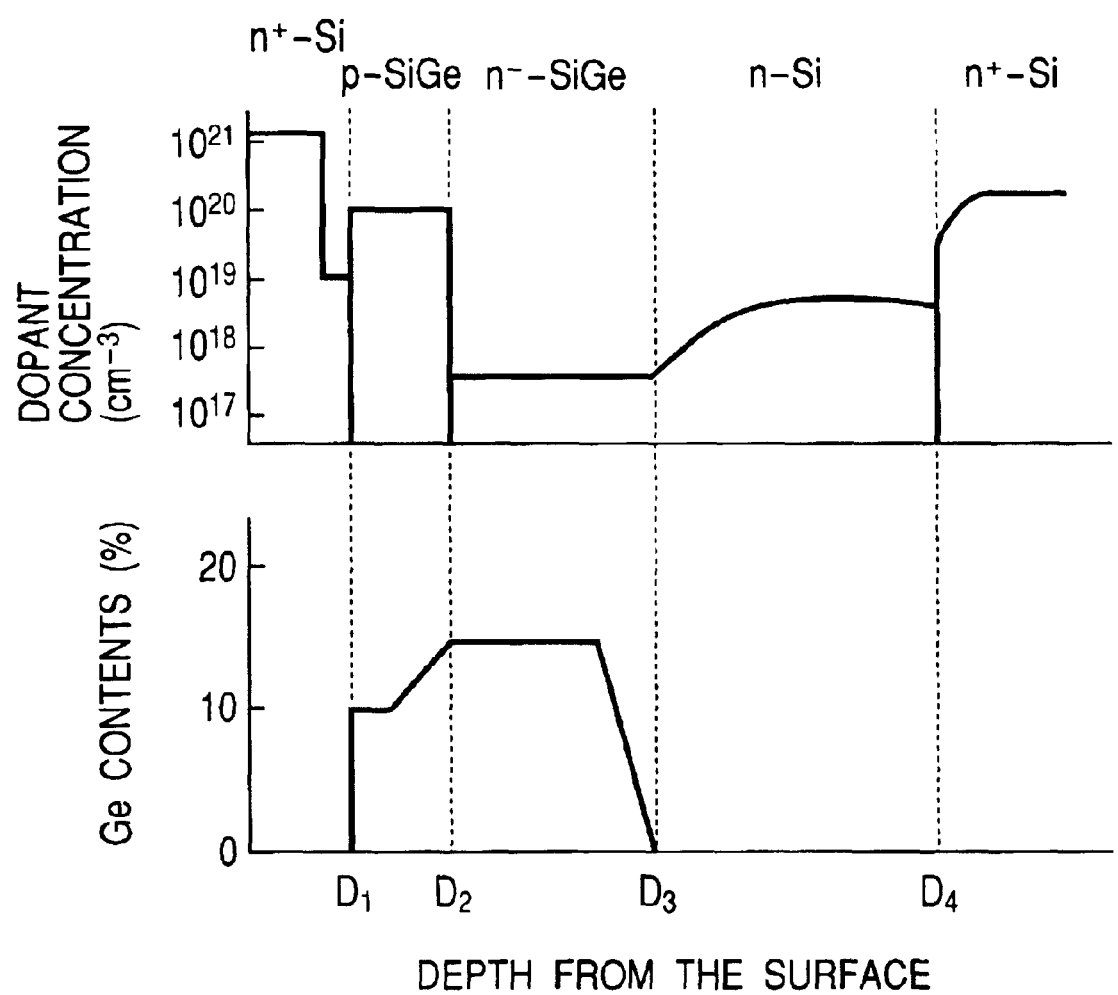
FIG. 21 is a graph showing the relationship between the dopant concentration and the profile of germanium content in the depthwise direction, in a semiconductor device in other example of the present invention.

This example demonstrates a bipolar transistor in which the present invention is applied to the collector-base-emitter layer. The transistor has a profile of germanium and dopant as shown in FIG. 21. The profile in this example differs from that in Example 7 in that the emitter concentration is reduced in the vicinity of the emitter-base junction. In other words, the section which is further away from the emitter-base junction is heavily doped. On account of this profile, tunnel current is suppressed and emitter resistance is reduced. In the case of doping with phosphorus as an n-type dopant, the phosphorus concentration in the n-type single-crystal silicon layer adjacent to the base should be no higher than $1\times10^{19}$ cm$^{-3}$ so that tunnel current at the emitter-base junction is reduced or no higher than $1\times10^{18}$ cm$^{-3}$ so that the emitter resistance does not increase. The doping concentration in the part which is away from the emitter-base junction should be no lower than $5\times10^{19}$ cm$^{-3}$, preferably no lower than $1\times10^{20}$ cm$^{-3}$, so that the emitter resistance is reduced. In addition, the doping concentration should not exceed $5\times10^{21}$ cm$^{-3}$; an excessively high doping concentration deteriorates crystal properties.

This example has the same effects as Example 7. Moreover, it produces an additional effect of improving the emitter-base breakdown voltage and reducing the emitter-base capacity. A bipolar transistor with these effects helps develop a new circuit with improved performance.

EXAMPLE 9

Figure 22:
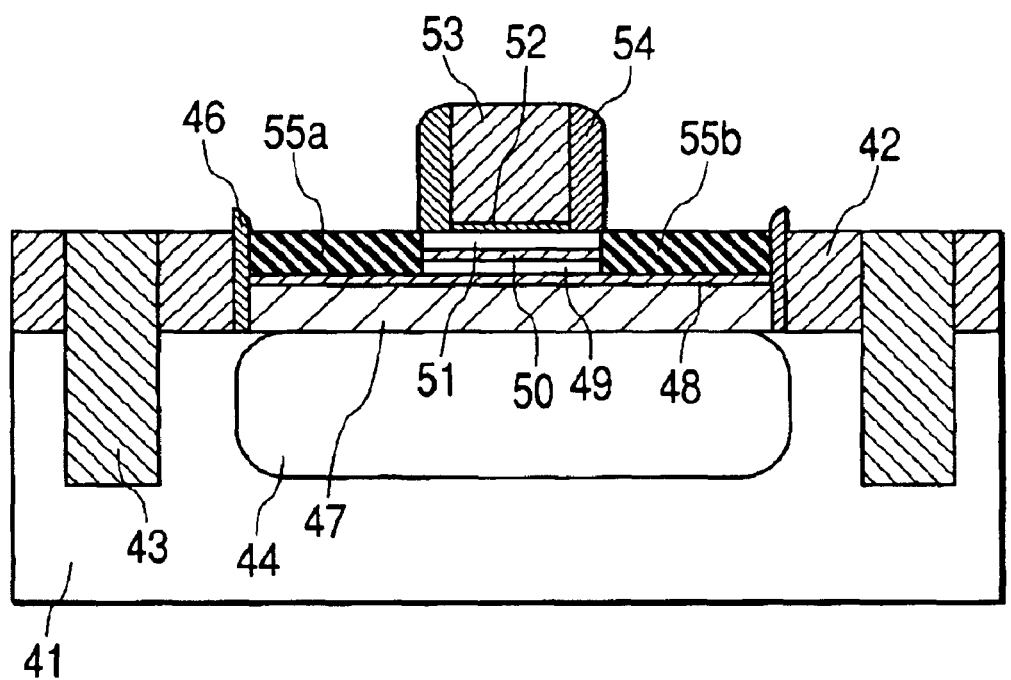
FIG. 22 is a sectional view of a semiconductor device in another example of the present invention.

This example demonstrates another semiconductor device according to the present invention. The semiconductor device is a pMODFET formed by epitaxial growth, whose sectional view is shown in FIG. 22. There is shown a silicon substrate 41. On the substrate, the pMODFET is formed, which is comprised of an n-well 44, a buffer layer 47, a multilayered film of single-crystal silicon and single-crystal silicon-germanium 48, 49, 50, and 51, a gate insulating film 52, a gate electrode 53, a source 55a, and a drain 55b. The semiconductor device shown in FIG. 22 is manufactured by the process which is explained below with reference to FIGS. 23 and 24.

Figure 23A:
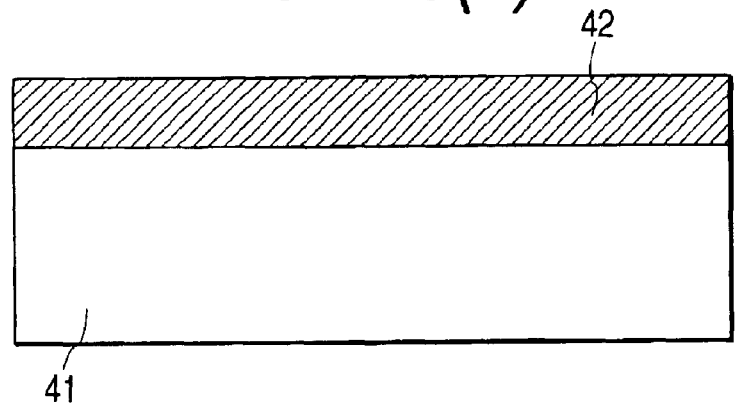
FIGS. 23(a) to 23(c) are partly enlarged sectional views showing the steps of manufacturing the semiconductor device shown in FIG. 22.
Figure 23B:
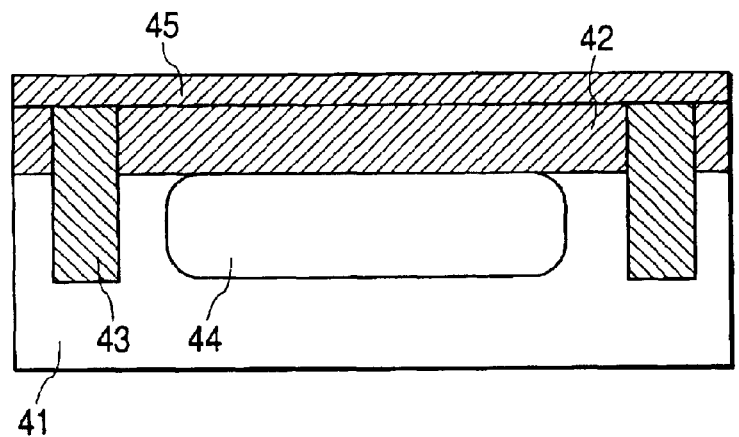
Figure 23C:
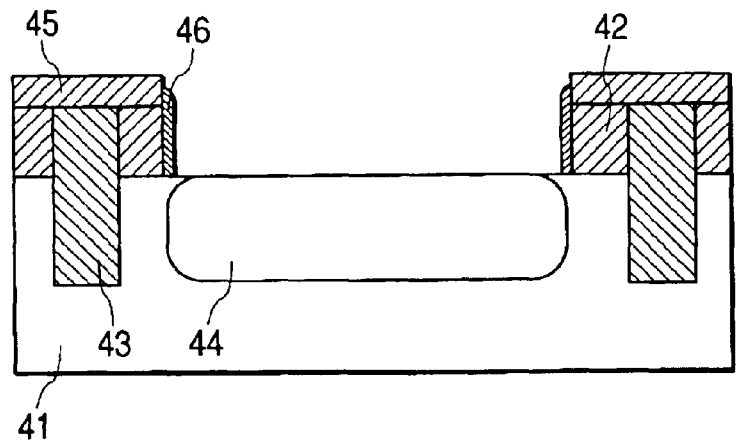
Figure 24A:
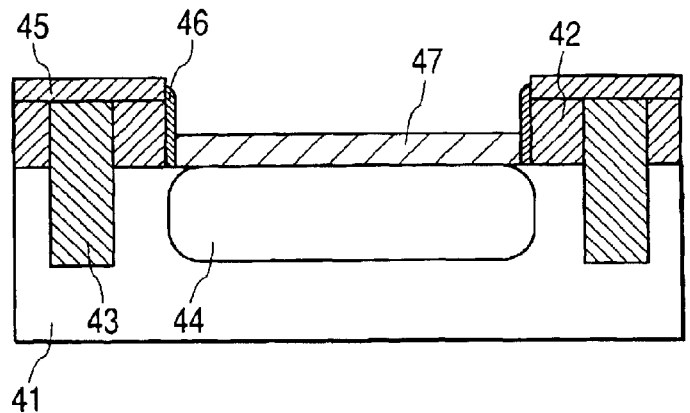
FIGS. 24(a) to 24(c) are partly enlarged sectional views showing the steps of manufacturing the semiconductor device shown in FIG. 22.

First, a field insulating film 42 is formed on the silicon substrate 41 (see, FIG. 23(a)). A trench at the boundary between adjacent devices is formed, and the trench is filled with an insulating material, so that an isolation region 43 is formed. The insulating material may be a laminate film comprised of insulating film and polycrystalline silicon. The description of the field oxide film 42 and the isolation region 43 also applies to the examples described below. Thereafter, an insulating film 45 is formed on the entire surface. This insulating film 45 (which later becomes the mask for selective epitaxial growth) should preferably be silicon oxide film with high selectivity. An n-well 44 is formed by selective ion implantation with n-type dopant in the region where the pMODFET is to be formed (see, FIG. 23(b)).

In the insulating film 45 and the field oxide film 42 is made an opening in which the intrinsic part of pMODFET is formed. On the side wall of the opening is selectively formed a silicon nitride film 46 (see, FIG. 23(c)). If the opening with a silicon nitride film 46 is formed on the silicon substrate 41, polycrystalline silicon or polycrystalline silicon-germanium tends to deposit on the silicon nitride film on account of its weaker selectivity as compared with the silicon oxide film. However, because of weak selectivity, epitaxial growth proceeds at the boundary between the silicon substrate 41 and the silicon nitride film 46. Hence, the single-crystal silicon layer or single-crystal silicon-germanium layer grows adjacent to the silicon nitride film.

There is the possibility of facet generation in the boundary of the silicon nitride film on account of low surface energy and low growth rate. The size of the facet is much smaller than the opening in the silicon oxide film. Thus, the selective epitaxial growth of single-crystal silicon-germanium in the opening of the field oxide film 45 having the silicon nitride film 46 on its side wall permits the formation of the buffer layer with limited facet generation.

Alternatively, the field insulating film 45 may be replaced by a silicon nitride film. In this case it is not necessary to form the silicon nitride film on the side wall. The buffer layer 47 is formed such that the germanium content increases in going from the silicon substrate 41 to the surface. The resulting buffer layer is relieved from strain due to a difference in lattice constant between the single-crystal silicon layer and the single-crystal silicon-germanium layer. Consequently, it has a surface with desirable crystallinity, and it forms a virtual substrate whose lattice constant is that of the single-crystal silicon-germanium layer. In the case where the germanium content uniformly increases from 5% to 30% in going from the silicon substrate 41 to the surface and the buffer layer is about 1.5 µm thick, it is possible to obtain a crystal plane in which strain is completely relieved. In the case where the germanium content is increased stepwise (instead of uniformly), it is possible to reduce the thickness of the buffer layer. For example, a buffer layer approximately 1.0 µm thick provides a satisfactory crystal plane (see, FIG. 24(a)).

Figure 24B:
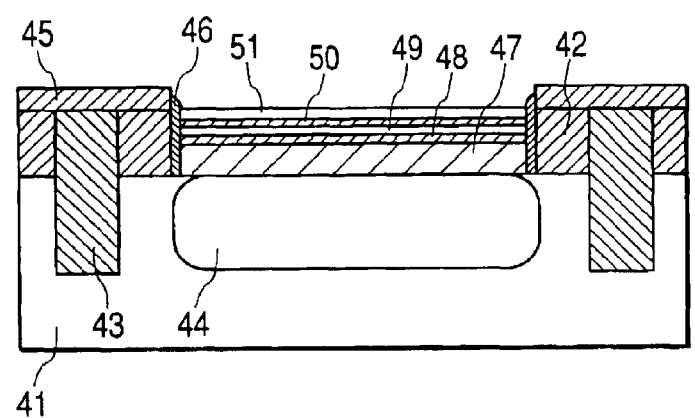
Figure 24C:
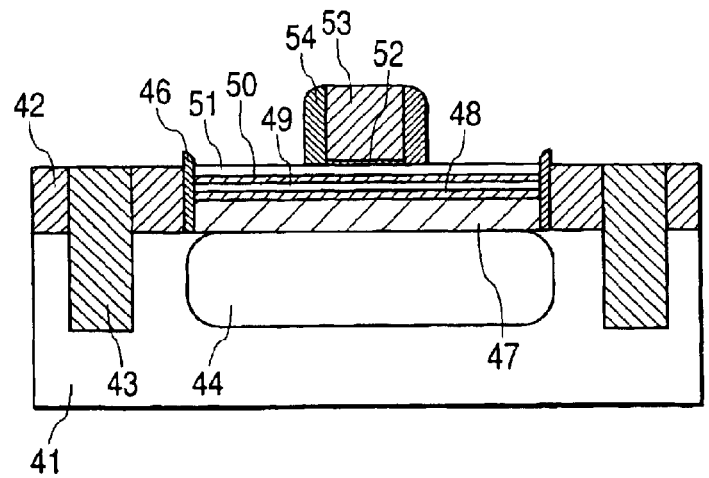

Subsequently, on the buffer layer 47 is formed a multilayered film comprised of single-crystal silicon and single-crystal silicon-germanium 48, 49, 50, and 51 by selective epitaxial growth in the same way as used to form the buffer layer 47 (see, FIG. 24(b)). On the buffer layer 47 is formed a carrier supply layer 48 (containing a p-type dopant) by selective epitaxial growth. The carrier supply layer 48 should have a germanium content which is equal to that in the surface of the buffer layer, and the dopant concentration should be no higher than $1\times10^{20}$ cm$^{-3}$ So that diffusion into the channel layer does not take place. Its thickness should be no smaller than 1 nm for epitaxial growth with sufficient control.

Thereafter, a spacer layer 49 is formed which is a single-crystal silicon-germanium as a barrier layer to confine carriers. This spacer layer should have a germanium content which is equal to that in the surface of the buffer layer 47, and its thickness should be from 1 nm (for epitaxial growth with good control) to 50 nm (for carrier supply to the channel layer). The channel layer 50 should have a higher germanium content than the spacer layer 49, so that it is under a state of compressive strain. For example, if the spacer layer 49 has a germanium content of 30% and the channel layer has a germanium content of 50%, then the channel layer receives compressive strain, causing the valence band to change. As a result, energy decreases relative to holes in the valence band of the channel layer and the quantum well structure appears. The well layer collects carriers supplied from the carrier layer 48, thereby forming the two-dimensional hole gas. The thickness of the channel layer should be no smaller than 1 nm for sufficient control of epitaxial growth.

On the channel layer is formed a cap layer 51 of single-crystal silicon which becomes a barrier layer for carriers and protects the silicon-germanium layer. For control from the gate electrode, the cap layer should have a thickness ranging from 1 nm (for easy control of epitaxial growth) to 50 nm (for carrier control of the channel layer by the gate electrode). The dopant concentration in the channel layer 50 should be as low as possible (no higher than $5\times10^{16}$ cm$^{-3}$, and preferably no lower than $1.45\times10^{10}$ cm$^{-3}$) because mobility decreases when carriers in the channel are scattered by impurities. If defects occur in the multilayered film or contaminants remain in the interface, carriers are scattered by the energy level (due to defects) and the interface state, with the result that mobility decreases and leakage current occurs.

Figure 25:
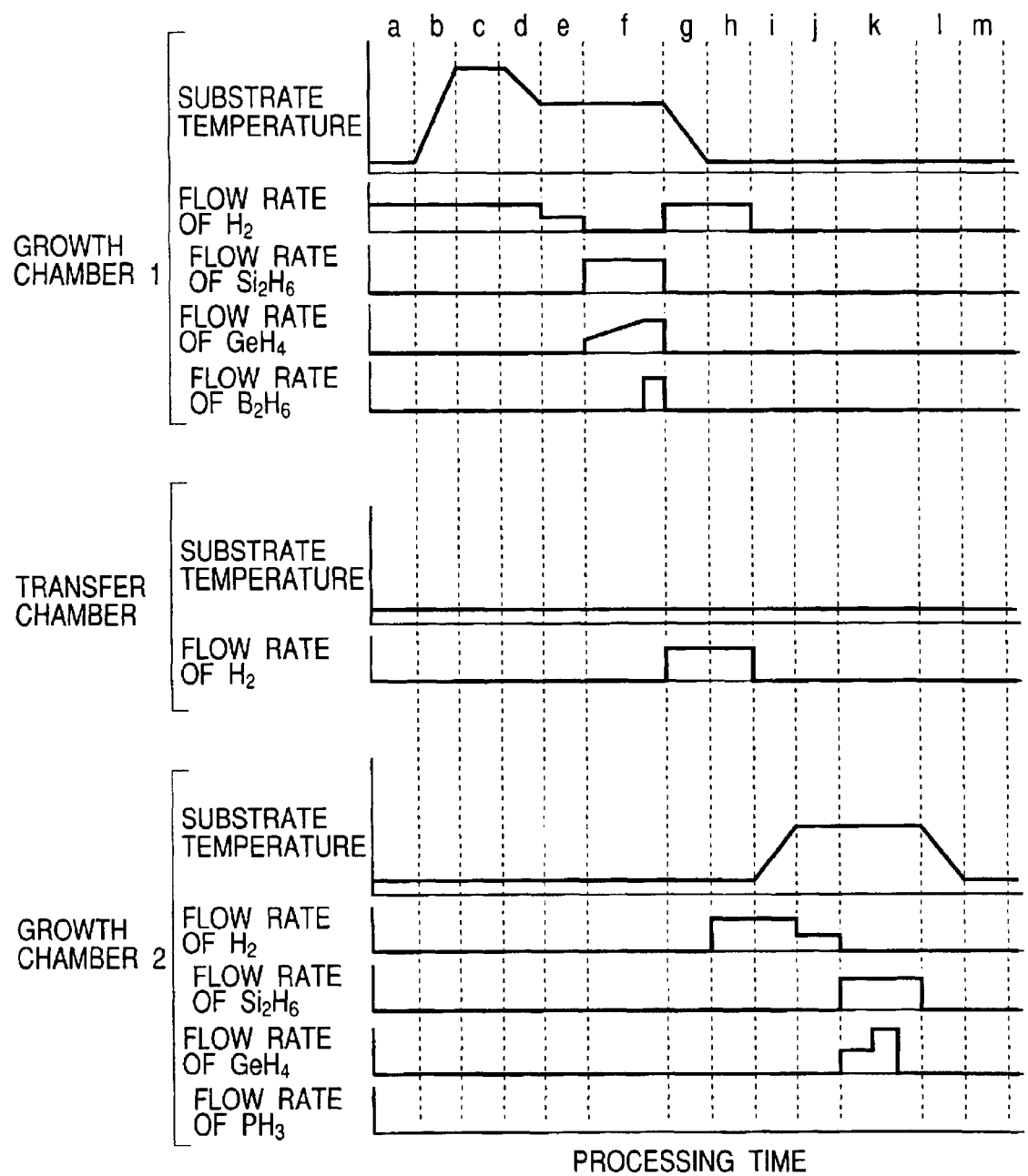
FIG. 25 is a diagram showing the growth sequence for the fabrication of the semiconductor device shown in FIG. 22.

In order to realize a high-performance MODFET, it is necessary to improve the crystallinity of the multilayered film and to prevent the interface state. This object is achieved by following the growth sequence for the multi-layered film as shown in FIG. 25. First, the doped carrier supply layer 48 is formed in growth chamber 1 ("step f"). Then, the substrate is transferred to growth chamber 2 ("step h"). The spacer layer 49, the channel layer 50, and the cap layer 51 are formed in growth chamber 2. In this way it is possible to reduce the, dopant concentration in the part excluding the carrier supply layer and to reduce contamination in the interface due to transfer through the hydrogen atmosphere.

In the example shown in FIG. 22, the carrier supply layer 48 is between the channel layer 48 and the buffer layer 47. However, the carrier layer 48 may be closer to the surface than the channel layer 50. In this case the channel layer and spacer layer are formed in growth chamber 1, the substrate is transferred to growth chamber 2 through the hydrogen atmosphere, and the carrier supply layer and cap layer are formed in growth chamber 2. When these multilayered films are formed, it is assumed that the dopant concentration in growth chamber 2 is sufficiently low.

The insulating film 52 and the gate electrode 53 are formed on the entire surface. The gate electrode 53 undergoes anisotropic etching. The gate-source and gate-drain isolating insulation film 54 is formed on the side wall of the gate electrode (see, FIG. 24(c)). Finally, the source 55a and drain 55b are formed by selective ion implantation with p-type dopant. Thus there is obtained the structure as shown in FIG. 22.

The pMODFET in this example is characterized by the low dopant concentration in its channel layer, which prevents scattering by impurities, ensures high-speed operation, and improves noise characteristics. Moreover, the pMODFET has a channel layer which is free of scattering by impurities and interface state. This helps reduce noise in the circuit. These characteristics contribute to high-speed, low-capacity, low-noise circuits and-also to high-speed, high-performance systems including such circuits.

EXAMPLE 10

Figure 26:
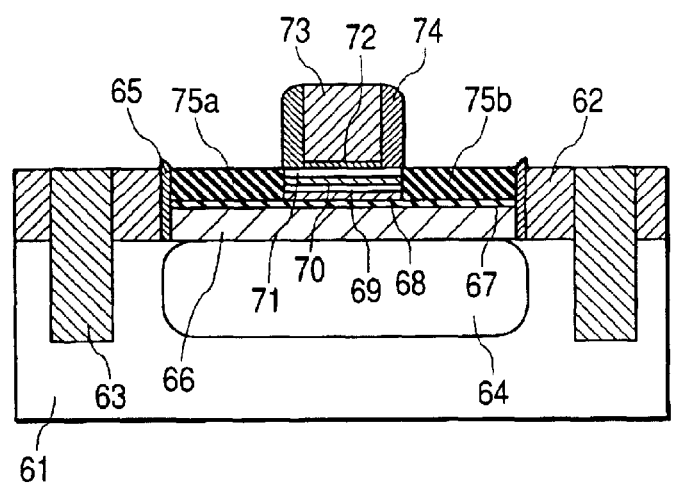
FIG. 26 is a sectional view of a semiconductor device in another example of the present invention.

This example demonstrates another semiconductor device pertaining to the present invention. The semiconductor device is an nMODFET whose sectional view is shown in FIG. 26. As with the pMODFET explained in Example 9, the nMODFET is formed on a silicon substrate 61 as follows. First, the p-well 64 is formed. In the opening of the field insulating film 62 are selectively formed the buffer layer 66 and the multilayered film of single-crystal silicon and single-crystal silicon-germanium 67, 68, 69, 70, and 71. The condition for selective epitaxial growth is the same as that in Example 9.

On the buffer layer 66 is formed (for carrier confinement) the spacer layer 67 of single-crystal silicon-germanium having the same germanium content as the surface of the buffer layer. The germanium content in this spacer layer should be equal to that in the surface of the buffer layer 66, and the thickness of the spacer layer should be 1 nm for easy control of epitaxial growth. Thereafter, the single-crystal silicon layer 68 which becomes the channel layer is formed. Owing to the buffer layer 66, epitaxial growth is performed on the virtual substrate-having the lattice constant of silicon-germanium. Therefore, the channel layer 68 of single-crystal silicon grows under tensile strain. For example, the channel layer 68 grown on the spacer layer 66 having a germanium content of 30% receives tensile strain, causing the conduction band to change. As a result, energy decreases relative to electrons in the conduction band of the channel layer and the quantum well structure appears. The well layer collects carriers, thereby forming the two-dimensional electron gas. The thickness of the channel layer 68 should be no smaller than 1 nm for good control of epitaxial growth.

A second spacer layer 69 as a carrier barrier layer is formed from single-crystal silicon-germanium having the same germanium content as that in the surface of the buffer layer. Then, the carrier supply layer 70 containing an n-type dopant is formed. The carrier supply layer 70 should have a germanium content which is equal to that in the surface of the buffer layer. The dopant concentration should be no higher than $1\times10^{20}$ cm$^{-3}$ so that diffusion into the channel layer does not occur. The thickness of the carrier supply layer 70 should be no smaller than 1 nm for easy control of epitaxial growth.

On the outermost surface of the multilayered film is formed the cap layer 71 of single-crystal silicon which becomes a barrier layer for carriers and protects the silicon-germanium layer. For control from the gate electrode, the cap layer should have a thickness ranging from 1 nm (for easy control of epitaxial growth) to 50 nm (for carrier control of the channel layer by the gate electrode). In this example, epitaxial growth is carried out in growth chamber 1 until the second spacer 69 is formed, and then the substrate is transferred to growth chamber 2 through the hydrogen atmosphere and subsequent steps to form the carrier supply layer 70, and other layers are carried out in growth chamber 2. In the example shown in FIG. 26, the carrier supply layer 70 is closer to the surface than the channel layer 68; however, the carrier supply layer 70 may be between the channel layer 68 and the buffer layer 66.

After the multilayered film of single-crystal silicon and single-crystal silicon-germanium has been formed, the gate insulating film 72 and the gate electrode 73 are formed. Finally, the source 75a and the drain 75b are given an n-type dopant by ion implantation. In this way the nMODFET is completed.

As in Example 9, the nMODFET in this example is characterized by the low dopant concentration in its channel layer, which prevents scattering by impurities, ensures high-speed operation, and improves noise characteristics. Moreover, the nMODFET has a channel layer which is free of scattering by impurities and interface state. This helps reduce noise in the circuit. These characteristics contribute to high-speed, low-capacity, low-noise circuits and also to high-speed, high-performance systems including such circuits.

EXAMPLE 11

Figure 27:
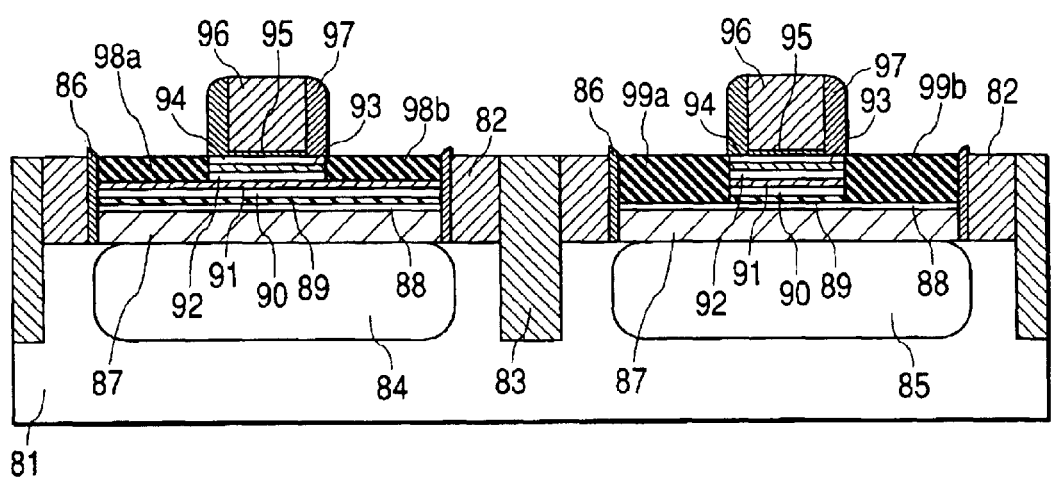
FIG. 27 is a sectional view of a semiconductor device in another example of the present invention.
Figure 28:
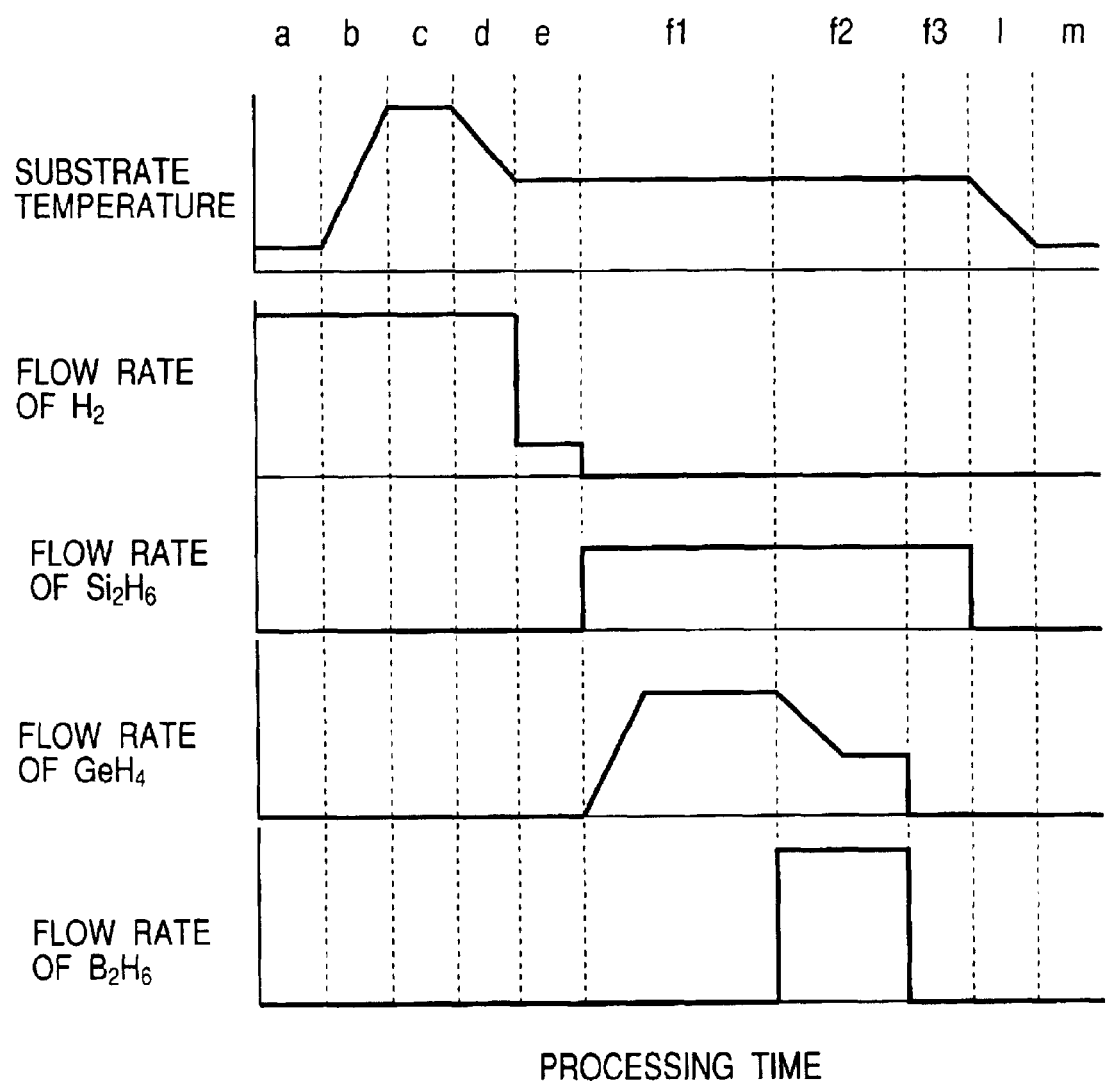
FIG. 28 is a diagram showing the growth sequence for the fabrication of a conventional semiconductor device.
Figure 29:
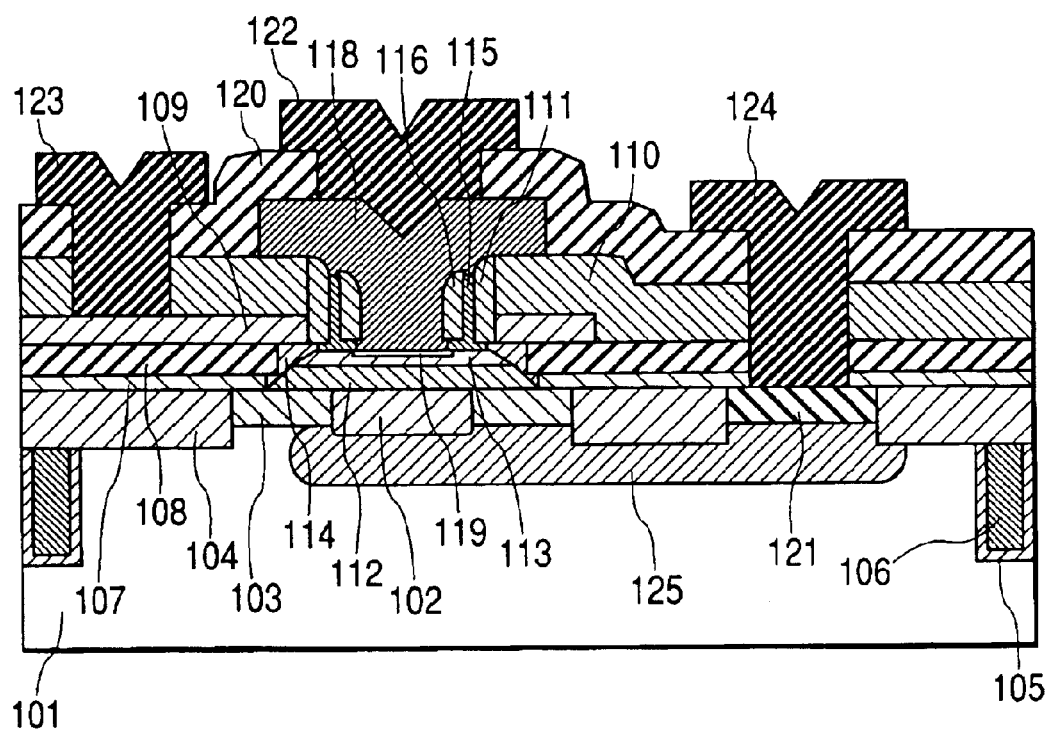
FIG. 29 is a sectional view showing the conventional semiconductor device.
Figure 30:
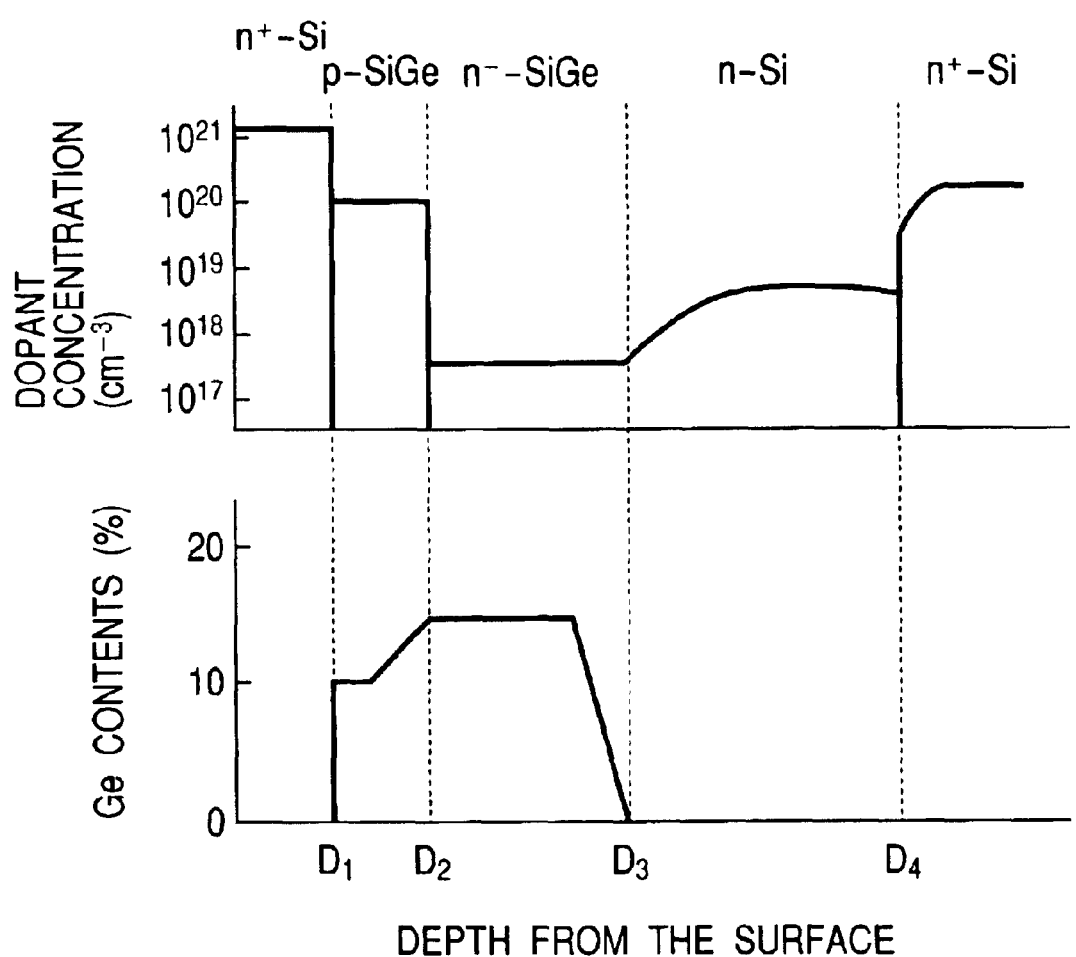
FIG. 30 is a graph showing the relationship between the dopant concentration and the profile of germanium content in the depthwise direction, before heat treatment, in the semiconductor device shown in FIG. 29.
Figure 31:
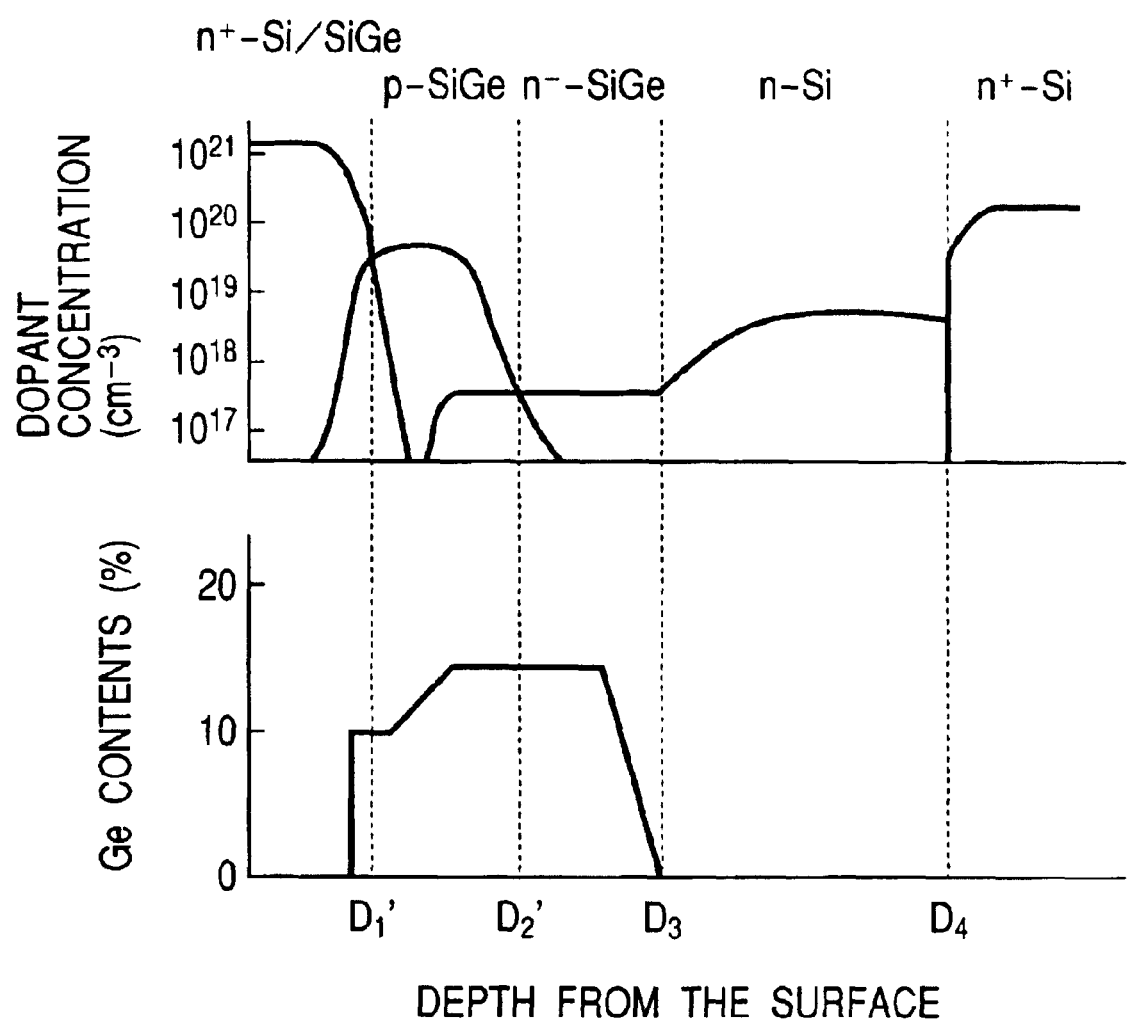
FIG. 31 is a graph showing the relationship between the dopant concentration and the profile of germanium content in the depthwise direction, after heat treatment, in the semiconductor device shown in FIG. 29.

This example demonstrates another semiconductor device pertaining to the present invention. The semiconductor device is a cMODFET whose sectional view is shown in FIG. 27. On the silicon substrate 81 are formed the p-well 81 and the n-well 84. An opening is made in the field insulating film 62, and the silicon nitride film 86 is formed on the side wall of the hole. In the openings of the nMODFET and pMODFET is selectively formed the buffer layer 87 of single-crystal silicon-germanium. On the buffer layer 87 is selectively formed the multilayered film of single-crystal silicon and single-crystal silicon-germanium 88, 89, 90, 91, 92, 93, and 94. The condition for selective epitaxial growth is the same as that in Example 9.

On the buffer layer 87 is formed (for carrier confinement) the spacer layer 88 of single-crystal silicon-germanium having the same germanium content as the surface of the buffer layer. The germanium content in this spacer layer should be equal to that in the surface of the buffer layer 87, and the thickness of the spacer layer should be 1 nm for easy control of epitaxial growth. Then, the carrier supply layer 89 containing an n-type dopant is formed. The carrier supply layer 89 should have a germanium content which is equal to that in the surface of the buffer layer. The dopant concentration should be no higher than $1 \times 10^{20}$ cm$^{-3}$ so that diffusion into the channel layer does not occur. The thickness of the carrier supply layer 89 should be no smaller than 1 nm for easy control of epitaxial growth.

A second spacer layer 90 of single-crystal silicon-germanium having the same germanium content as that in the surface of the buffer layer is then formed. The second spacer layer 90 functions as a carrier barrier layer. Thereafter, the single-crystal silicon layer 91 is formed which becomes the n-channel layer. Owing to the buffer layer 87, epitaxial growth is performed on the virtual substrate having the lattice constant of silicon-germanium. Therefore, the channel layer 91 of single-crystal silicon grows under tensile strain. For example, the n-channel layer grown on the spacer layer 90 having a germanium content of 30% receives tensile strain, causing the conduction band to change. As a result, energy decreases relative to electrons in the conduction band of the n-channel layer and the quantum well structure appears. The well layer collects n-type carriers, contributing to the transistor action.

The thickness of the p-channel layer should be no smaller than 1 nm for sufficient control of epitaxial growth. On the n-channel is formed the p-channel layer 92 of single-crystal silicon-germanium which has a higher germanium content than the buffer layer 87. On account of the high germanium content, the p-channel layer 92 receives compressive strain. As a result, energy decreases relative to holes in the valence band and the quantum well structure appears. The well layer collects p-type carriers, thereby functioning as the p-channel.

On the p-channel layer 92 is formed a third spacer layer 93 of single-crystal silicon-germanium which functions as a barrier layer for p-type carrier. On the outermost surface is formed the cap layer 94 of single-crystal silicon to protect the silicon-germanium layer. For control from the gate electrode, the cap layer should have a thickness ranging from 1 nm (for easy control of epitaxial growth) to 50 nm (for carrier control of the channel layer by the gate electrode).

In this example, epitaxial growth is carried out in growth chamber 1 until the carrier supply layer 89 is formed, and then the substrate is transferred to growth chamber 2 through the hydrogen atmosphere, and subsequent steps to form the second spacer layer 90 and other layers are carried out in growth chamber 2.

After the multilayered film of single-crystal silicon and single-crystal silicon-germanium has been formed, the gate insulating film 95 and the gate electrode 96 are formed in the cMODFET. The n-type source 99a and the n-type drain 99b are formed by selective ion implantation with an n-type dopant in the region which becomes the nMODFET. Similarly, the p-type source 98a and the p-type drain 98b are formed by selective ion implantation with a p-type dopant in the region which becomes the pMODFET. The same steps may be used in common to form the nMODFET and pMODFET (including the buffer layer 87 and the multilayered film of single-crystal silicon and single-crystal silicon-germanium) The resulting cMODFET contributes to high-speed circuits, such as high-frequency IC for mobile communication and high-speed processors.

The foregoing is concerned with the preferred embodiments of the present invention. The present invention is not limited thereto; the invention may be modified and changed without departing from the spirit and scope thereof. For example, although the multilayered film of p-type single-crystal silicon-germanium layer and n-type single-crystal silicon-germanium layer has been mentioned above, these layers may be replaced by single-crystal silicon-germanium-carbon layers.

It is apparent from the above-mentioned examples that the semiconductor device according to the present invention has a multilayered film comprised of a plurality of single-crystal layers differing in conductivity type or impurity concentration, such that contamination is reduced in the interface between the constituting layers. Moreover, the present invention permits the impurity concentration in the multilayered film to be controlled accurately with good reproducibility. Therefore, the present invention offers a semiconductor device which has a very thin junction with a high concentration. This semiconductor device can be used to manufacture high-speed, low-noise bipolar transistors.

In the case where the semiconductor device has a multi-layered film comprised of heavily doped single-crystal layers differing in conductivity type and an undoped layer, it is possible to reduce the impurity concentration in the undoped layer. When it is applied to bipolar transistors, it is possible to reduce junction capacity and improve breakdown voltage. Such bipolar transistors may help improve the performance of the circuits in which they reside. In addition, the MODFET based on the present invention has a high speed and a low noise level.

Also, although the focus of this disclosure has centered on successive layers of opposite conductivity types, the present invention may also be used to produce successive layers that include different concentrations of impurities (dopants) even if the impurities are of the same conductivity type. In this way, altering the concentration of the dopant, rather than the conductivity-type of the dopant, produces the desired results.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. An apparatus adapted to manufacture a semiconductor device with a plurality of semiconductor layers, comprising:
   a first growth chamber;
   a second growth chamber; and
   a transfer chamber connecting the first growth chamber to the second growth chamber, said transfer chamber including a hydrogen gas source adapted to provide hydrogen gas to the semiconductor device when the device is in the transfer chamber, wherein vacuum rates of the first growth chamber, the second growth chamber and the transfer chamber are no higher than $1 \times 10^{-5}$ Pa.

2. The apparatus according to claim 1, further comprising:
   a cleaning chamber connected to said transfer chamber, wherein a vacuum rate of the cleaning chamber is no higher than $1 \times 10^{-5}$ Pa.

3. The apparatus according to claim 2, wherein said cleaning chamber is adapted to heat said device in the presence of hydrogen.

4. The apparatus according to claim 1, wherein said first and second growth chambers are adapted to heat the device in the presence of hydrogen to clean the surface of the device before forming semiconductor layers thereon.

5. The apparatus of claim 4, wherein said hydrogen is elemental hydrogen.

* * * * *